(12) United States Patent
Inoue et al.

(10) Patent No.: US 8,502,440 B2
(45) Date of Patent: Aug. 6, 2013

(54) ORGANIC ELECTROLUMINESCENT LIGHT SOURCE

(75) Inventors: Hiroyasu Inoue, Tokyo (JP); Hirotoshi Tanimoto, Tokyo (JP)

(73) Assignee: Zeon Corporation, Tokyo (JP)

( * ) Notice: Subject to any disclaimer, the term of this patent is extended or adjusted under 35 U.S.C. 154(b) by 0 days.

(21) Appl. No.: 12/989,196

(22) PCT Filed: Apr. 10, 2009

(86) PCT No.: PCT/JP2009/057365
§ 371 (c)(1),
(2), (4) Date: Oct. 22, 2010

(87) PCT Pub. No.: WO2009/131019
PCT Pub. Date: Oct. 29, 2009

(65) Prior Publication Data
US 2011/0050082 A1 Mar. 3, 2011

(30) Foreign Application Priority Data
Apr. 22, 2008 (JP) ................ 2008-111688

(51) Int. Cl.
*H01L 51/50* (2006.01)
(52) U.S. Cl.
USPC .......................................... 313/483
(58) Field of Classification Search
USPC ............................... 313/483–486
See application file for complete search history.

(56) References Cited

U.S. PATENT DOCUMENTS 6,787,976 B2 * 9/2004 Minoura et al. ............ 313/110
2004/0012980 A1 1/2004 Sugiura et al.
2004/0195962 A1 10/2004 Nakamura et al.
2004/0211971 A1 10/2004 Takei et al.
2006/0108580 A1 5/2006 Yoshida et al.
2007/0230211 A1 10/2007 Osato et al.
2007/0290607 A1 12/2007 Okada et al.
2008/0272689 A1 11/2008 Ide et al.
2010/0110724 A1 * 5/2010 Moncrieff ................ 362/606

FOREIGN PATENT DOCUMENTS

| EP | 1 424 739 A2 | 6/2004 |
| EP | 1 641 054 A2 | 3/2006 |
| JE | 2006-107745 A | 4/2006 |
| JP | 2002-251145 A | 9/2002 |

(Continued)

OTHER PUBLICATIONS

Extended European Search Report dated Jun. 14, 2011, PCT/JP2009057365; EP 09735776.

(Continued)

*Primary Examiner* — Anh Mai
*Assistant Examiner* — Hana Featherly
(74) *Attorney, Agent, or Firm* — Birch, Stewart, Kolasch & Birch, LLP

(57) ABSTRACT

An organic electroluminescent light source device includes, in the following order from a light-emitting surface side, a first transparent electrode layer, a luminescent layer, a second transparent electrode layer, and a reflecting layer, wherein the reflecting layer includes a concavo-convex structure with an average inclination angle of 12 to 45°. An organic electroluminescent light source device includes, in the following order, a first transparent electrode layer, a luminescent layer, a second transparent electrode layer, a diffusing layer, and a reflecting-scattering layer, wherein the diffusing layer has a concavo-convex surface including a concavo-convex structure with an average inclination angle of 17 to 45°.

12 Claims, 11 Drawing Sheets

FOREIGN PATENT DOCUMENTS

| | | |
|---|---|---|
| JP | 2003-7450 A | 1/2003 |
| JP | 2003-36969 A | 2/2003 |
| JP | 2001-125916 A | 4/2004 |
| JP | 2004-212716 A | 7/2004 |
| JP | 2004-296423 A | 10/2004 |
| JP | 2006-92936 A | 4/2006 |
| JP | 2007-200597 A | 8/2007 |
| WO | WO 2005066538 A1 * | 7/2005 |
| WO | WO 2005/094130 A1 | 10/2005 |
| WO | 2007/038070 A1 | 4/2007 |
| WO | WO 2007/097454 A1 | 8/2007 |

OTHER PUBLICATIONS

International Search Report for PCT/JP2009/057365 dated Jul. 21, 2009.

European Search Report dated Feb. 6, 2012 for Application No. EP 11194793.

Japanese Office Action from Japanese Patent Application No. 2010-258812 mailed Mar. 26, 2013, with English Translation.

* cited by examiner

ORGANIC ELECTROLUMINESCENT LIGHT SOURCE

TECHNICAL FIELD

The present invention relates to an organic electroluminescent (which may be abbreviated hereinbelow as "organic EL") light source device.

BACKGROUND ART

An organic EL light source device (which may be referred to as an organic EL device) is a device that has an organic luminescent layer between a plurality of electrodes to achieve electrical luminescence. Organic EL elements are contemplated to be used as display elements as an alternative to liquid crystal cells. In addition, the organic EL elements are also contemplated to be used as surface light sources such as flat lighting devices and the backlights for liquid crystal displays, taking advantage of the characteristics such as high luminescence efficiency, low driving voltage, light weight, and low cost.

When an organic EL device is used as a surface light source, it is necessary to extract light from the organic EL device in a useful form at high efficiency. Specifically, even though the luminescent layer of the organic EL element itself has high light-emitting efficiency, the amount of light can be disadvantageously reduced before the light emission as the light passes through the multilayer structure that constitutes the element, due to, for example, interference in the layers. Therefore, there is a demand to render such loss of light as little as possible.

As a strategy for improving the light extraction efficiency, for example, Patent Document 1 (Japanese Patent Application Laid-Open No. 2004-296423 (counterpart publication: U.S. Patent Application Publication No. 2004195962)) discloses reduction of the brightness in a front direction (0°) of the device for increasing the brightness at angles in the range of 50 to 70°, whereby the overall brightness of a device is increased.

DISCLOSURE OF INVENTION

Problem to be Solved by the Invention

However, with the light source devices, there is a demand to further improve their light extraction efficiency.

When an organic EL device is used as a light source, its low durability can also be a problem. Aiming at improving the durability, an organic EL device is usually configured such that its luminescent layer is hermetically sealed between a substrate and a sealing substrate to prevent encroach of oxygen, water, etc. from the outside. However, in such a configuration, improvement in barrier properties is accompanied by problems such as an increase in the thickness of the element.

Accordingly, it is an object of the present invention to provide an organic EL light source device that has high light extraction efficiency and can have improved durability without an increase in its thickness.

Means for Solving Problem

The present inventors have conducted studies to solve the aforementioned problems and found out that the problems can be solved by an organic EL light source device having a pair of electrodes constituting a luminescent element both of which are made transparent, and having a reflecting layer having a concavo-convex structure with a specific average inclination angle or a combination of a diffusing layer with a specific average inclination angle and a reflecting layer. The present inventors thus have solved the problems.

Accordingly, the present invention provides [1] to [13] described below.

(1) An organic electroluminescent light source device, comprising a first transparent electrode layer, a luminescent layer, a second transparent electrode layer, and a reflecting layer, the layers being in this order from a light-emitting surface side, wherein:
the reflecting layer has a reflecting layer concavo-convex structure with an average inclination angle of 12 to 45°.

(2) The organic electroluminescent light source device according to (1), further comprising a sealing layer disposed between the second transparent electrode layer and the reflecting layer, wherein:
the sealing layer is in direct contact with the second transparent electrode layer and with the reflecting layer.

(3) The organic electroluminescent light source device according to (1) or (2), wherein:
the reflecting layer concavo-convex structure is a structure having a curved surface.

(4) The organic electroluminescent light source device according to any one of (1) to (3), further comprising a light-emitting surface diffusing layer disposed at a position closer to a light-emitting surface than the first transparent electrode layer.

(5) The organic electroluminescent light source device according to any one of (1) to (4), wherein:
the light-emitting surface diffusing layer has on the light-emitting surface side surface thereof a light-emitting surface diffusing layer concavo-convex structure, the light-emitting surface diffusing layer concavo-convex structure consisting of ridge-shaped concavo-convex structure units, and
the reflecting layer concavo-convex structure consists of ridge-shaped concavo-convex structure units.

(6) The organic electroluminescent light source device according to any one of (1) to (5), wherein:
the reflecting layer has, as the reflecting layer concavo-convex structure, a corrugation structure obtained by:
forming a thin film on one surface of a reflecting layer film substrate to produce a multilayer body, and
shrinking the multilayer body in at least one in-plane axial direction to corrugate the thin film.

(7) The organic electroluminescent light source device according to any one of (1) to (6), wherein:
the reflecting layer has a metal layer.

(8) The organic electroluminescent light source device according to (7), wherein:
the reflecting layer further has a functional layer provided on a surface of the metal layer.

(9) An organic electroluminescent light source device, comprising a first transparent electrode layer, a luminescent layer, a second transparent electrode layer, a diffusing layer, and a reflecting-scattering layer, the layers being in this order from a light-emitting surface side, wherein:
the diffusing layer has a concavo-convex surface, the concavo-convex surface having a concavo-convex structure with an average inclination angle of 17 to 45°.

(10) The organic electroluminescent light source device according to (9), wherein:
the concavo-convex surface is a surface containing a curved surface.

(11) The organic electroluminescent light source device according to (9) or (10), further comprising a light-emitting surface diffusing layer disposed at a position closer to a light-emitting surface than the first transparent electrode layer.

(12) The organic electroluminescent light source device according to (11), wherein:

the light-emitting surface diffusing layer has on the light-emitting surface side surface thereof a light-emitting surface diffusing layer concavo-convex structure, the light-emitting surface diffusing layer concavo-convex structure consisting of ridge-shaped concavo-convex structure units, and the concavo-convex structure of the concavo-convex surface consists of ridge-shaped concavo-convex structure units.

(13) The organic electroluminescent light source device according to any one of (9) to (12), wherein:

the diffusing layer and the reflecting-scattering layer are provided with an air layer disposed therebetween.

Effect of the Invention

The light source device of the present invention has high light extraction efficiency and can have high durability even though they have simple and thin profiles. Therefore, the light source device is useful as a backlight for a liquid crystal display and a light source for, e.g., a lighting device.

BEST MODES FOR CARRYING OUT THE INVENTION

Preferred embodiments of the present invention will be described hereinbelow with reference to the drawings.

(First Embodiment)

Figure 1:
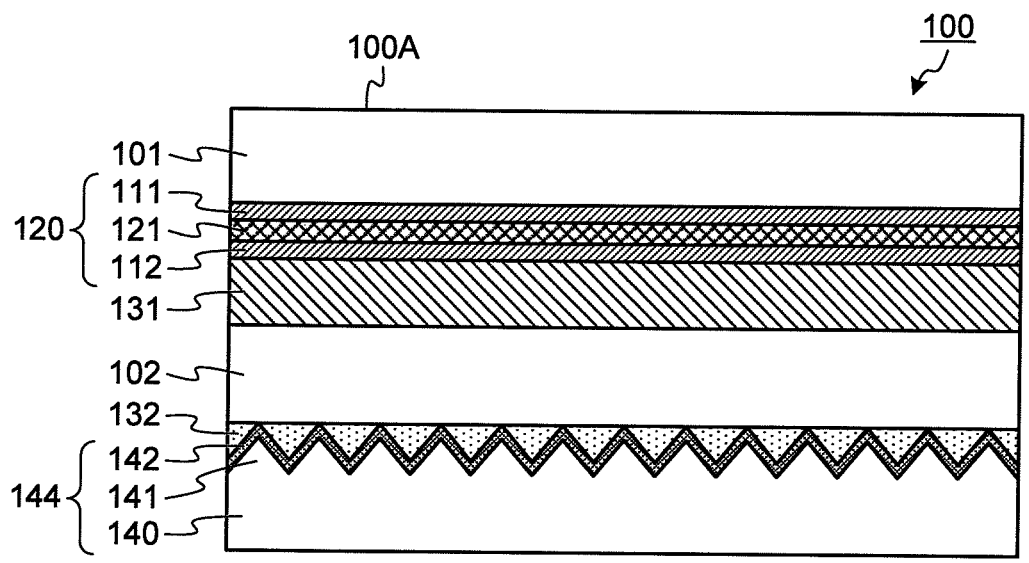
FIG. 1 is a vertical cross-sectional view schematically illustrating an organic EL light source device according to one embodiment of the present invention.

FIG. 1 is a vertical cross-sectional view illustrating the layer configuration of an organic EL light source device according to a first embodiment of the present invention. In the present application, unless otherwise specified, light source devices will be described with the luminescent layer of the device extending horizontally and with the light-emitting surface of the device facing up. Therefore, in the following description, unless otherwise specified, a "horizontal plane" is a plane parallel to the principal surface of the luminescent layer; the upper side of the light source device is the light-emitting surface side; and the lower side is the side opposite to the light-emitting surface.

In FIG. 1, the device 100 includes: a substrate 101; a luminescent element 120 provided on the lower side of the substrate 101; a sealing substrate 102 provided on the lower side of the luminescent element 120 via a sealing layer 131; and a reflecting member 144 bonded to the lower side of the sealing substrate 102 via a bonding layer 132. The luminescent element 120 is sealed by the sealing layer 131, the sealing substrate 102, and the substrate 101, whereby the luminescent element 120 is prevented from being degraded by contact with oxygen, water, etc. from the outside air during use of the light source device 100.

The reflecting member 144 includes: a reflecting substrate 140 having a concavo-convex structure 141 on its upper surface; and a reflecting layer 142 provided on the concavo-convex structure 141 on the upper surface of the reflecting substrate 140. The reflecting layer 142 is bonded to the lower side of the sealing substrate 102 via the bonding layer 132.

(Substrate and Sealing Substrate)

As the substrate 101 and the sealing substrate 102, substrates that are usually used as the substrates of organic light-emitting devices may be used. Examples of the materials for forming such substrates may include glass, quartz glass, and plastic. The material for forming the substrate 101 may be the same as or different from the material for forming the sealing substrate 102. The thickness of each of the substrate and the sealing substrate may be 0.01 to 5 mm.

(Luminescent Element)

In the present embodiment, the luminescent element 120 has a first transparent electrode layer 111, a luminescent layer 121, and a second transparent electrode layer 112, in this order.

No particular limitation is imposed on the luminescent layer 121 in the luminescent element 120, and any known luminescent element may be appropriately selected. In order to adapt the device to the light source application, the layer 121 may be selected, as a single layer or a combination of a plurality of layers, so as to emit light containing a specific peak wavelength which will be described later.

The first transparent electrode layer 111 is disposed at a position closer to the light-emitting surface than the luminescent layer 121, and the second transparent electrode layer 112 is disposed at a position closer to the reflecting layer than the luminescent layer 121. No particular limitation is imposed on the material for forming the transparent electrode layers, and any known material used as the electrodes of an organic EL luminescent element may be appropriately selected. One of the transparent electrode layers may be used as an anode, and the other one may be used as a cathode. In addition to the luminescent layer, other layers such as a hole injection layer, a hole transport layer, an electron transport layer, an electron injection layer, and a gas barrier layer may be disposed between the electrodes.

Examples of the materials for the first transparent electrode layer 111 and the second transparent electrode layer 112 may include metal thin films, ITO, IZO, and $SnO_2$.

Specific examples of the layer configuration of the luminescent element may include: a configuration of anode/hole transport layer/luminescent layer/cathode; a configuration of anode/hole transport layer/luminescent layer/electron injection layer/cathode; a configuration of anode/hole injection layer/luminescent layer/cathode; a configuration of anode/hole injection layer/hole transport layer/luminescent layer/electron transport layer/electron injection layer/cathode; a configuration of anode/hole transport layer/luminescent layer/electron injection layer/equipotential surface forming layer/hole transport layer/luminescent layer/electron injection layer/cathode; and a configuration of anode/hole transport layer/luminescent layer/electron injection layer/charge generation layer/hole transport layer/luminescent layer/electron injection layer/cathode. The luminescent element in the organic EL light source device of the present invention may include one or more luminescent layers between the anode and cathode. The one or more luminescent layers may be a multilayer body of a plurality of layers having different light emission colors or may include a mixed layer formed by doping a coloring agent layer with different coloring agents. No particular limitation is imposed on the material for each of the aforementioned layers. Examples of the material for forming the luminescent layer may include poly-p-phenylene vinylene-based, polyfluorene-based, and polyvinylcarbazole-based materials. Examples of the materials for the hole injection layer and the hole transport layer may include phthalocyanine-based, arylamine-based, and polythiophene-based materials. Examples of the materials for the electron injection layer and the electron transport layer may include aluminum complexes and lithium fluoride. Examples of the equipotential surface forming layer and the charge generation layer may include transparent electrodes such as ITO, IZO, and $SnO_2$ electrodes and metal thin films such as Ag and Al thin films.

The first transparent electrode layer 111, the luminescent layer 121, the second transparent electrode layer 112, and any other optional layers that constitute the luminescent element may be provided by sequentially forming these layers on the substrate 101. The thicknesses of these layers may be 10 to 1,000 nm.

(Sealing Layer)

The material for forming the sealing layer 131 may be any of various resins that can bond the second transparent electrode layer 112 and the sealing substrate 102 to each other and can prevent the luminescent element 120 from being degraded by water, oxygen, etc. in the air during use of the device. The material for forming the sealing layer 131 is not limited to a solid. For example, any of inert liquids such as fluorinated hydrocarbons and silicon oil and liquid crystal materials such as nematic liquid crystal and smectic liquid crystal materials may be used. In particular, when a liquid crystal material is used as the material for forming the sealing layer 131, light that vibrates in a high-refractive index direction can be efficiently extracted, and therefore the light extraction efficiency can be improved.

An example of the resin material for the sealing layer may be a hot-melt adhesive resin that melts when heated and sets when cooled. The glass transition temperature (Tg) of the hot-melt adhesive resin for use may be usually −50 to 200° C., preferably −10 to 100° C., more preferably 20 to 90° C., and particularly preferably 50 to 80° C. When the glass transition temperature falls within the aforementioned preferred ranges, a light source device having sufficient thermal resistance can be obtained, and the bonding can be made without damaging the luminescent layer that is a part of the light source device.

The adhesive resin for use may be a cyclized product of a conjugated diene polymer produced by subjecting a conjugated diene polymer to a cyclization reaction. The cyclized product of the conjugated diene polymer may have an "unsaturated bond reduction ratio" of 30% or more, wherein the ratio is a percentage of the number of unsaturated bonds reduced by the cyclization of the conjugated diene polymer with respect to the number of unsaturated bonds in the conjugated diene polymer. As the adhesive resin, a resin containing the cyclized product of the conjugated diene polymer and an alicyclic olefin resin may also be used.

The cyclized product of the conjugated diene polymer is obtained by subjecting the conjugated diene polymer to a cyclization reaction in the presence of an acid catalyst. As the conjugated diene polymer, a homopolymer or a copolymer of conjugated diene monomers or a copolymer of a conjugated diene monomer and another monomer may be used.

No particular limitation is imposed on the conjugated diene monomer. Specific examples thereof may include 1,3-butadiene, isoprene, 2,3-dimethyl-1,3-butadiene, 2-phenyl-1,3-butadiene, 1,3-pentadiene, 2-methyl-1,3-pentadiene, 1,3-hexadiene, 4,5-diethyl-1,3-octadiene, and 3-butyl-1,3-octadiene. Any one species of these monomers may be used alone or two or more thereof may be used in combination.

Specific examples of the conjugated diene polymer may include: homopolymers and copolymers of conjugated dienes such as natural rubber, polyisoprene, and butadiene-isoprene copolymers; and copolymers of conjugated dienes and other monomers such as styrene-butadiene copolymers, styrene-isoprene copolymers, isoprene-isobutylene copolymers, ethylene-propylene-diene-based copolymer rubber, and aromatic vinyl-conjugated diene block copolymers such as styrene-isoprene block copolymers. Of these, natural rubber, polyisoprene, and styrene-isoprene block copolymers are preferred, and polyisoprene and styrene-isoprene block copolymers are more preferred.

As the cyclized product of the conjugated diene polymer, it is preferable to use a modified cyclized product of the conjugated diene polymer, wherein the modification is effected with a polar group. The modified cyclized product of the conjugated diene polymer provides bondability for bonding materials to be bonded. In addition, when the adhesive resin contains fine particles, the modified cyclized product of the conjugated diene polymer has an effect of improving the dispersion properties of the fine particles. The adhesive resin may contain one species of the modified cyclized product of the conjugated diene polymer having a polar group or may contain a plurality of the species thereof having different polar groups. In addition, a cyclized product of the conjugated diene polymer having two or more types of functional groups may also be used.

No particular limitation is imposed on the polar group. Examples thereof may include acid anhydride, carboxyl, hydroxyl, thiol, ester, epoxy, amino, amide, cyano, and silyl groups and halogens.

Examples of the acid anhydride and carboxyl groups may include those having a structure obtained by addition of a compound to the cyclized product of the conjugated diene polymers, wherein the compound to be added may be maleic anhydride, itaconic anhydride, aconitic anhydride, norbornene dicarboxylic anhydride, and vinyl carboxylic acid compounds such as acrylic acid, methacrylic acid, and maleic acid. Of theses, a group having a structure obtained by addition of maleic anhydride to the cyclized product of the conjugated diene polymer is preferred in terms of reactivity and economical efficiency.

The amide group may be introduced, e.g., by the following methods: an amide group introduction method in which an unsaturated compound containing an amide group is grafted to a cyclized product of the conjugated diene polymer; and a method in which an unsaturated compound containing a functional group is used to introduce the functional group and then the introduced functional group is reacted with a compound containing an amide group. Examples of the unsaturated compound containing an amide group may include acrylamide, N-isopropylacrylamide, N,N-dimethylacrylamide, and N-benzylacrylamide.

Examples of the hydroxyl group may include those having a structure obtained by addition of a compound to the cyclized product of the conjugated diene polymers, wherein the compound to be added may be hydroxy alkyl esters of unsaturated acids such as 2-hydroxyethyl (meth)acrylate and 2-hydroxypropyl (meth)acrylate; unsaturated acid amides having a hydroxyl group such as N-methylol (meth)acrylamide and N-(2-hydroxyethyl) (meth)acrylamide; polyalkylene glycol monoesters of unsaturated acids such as polyethylene glycol mono(meth)acrylate, polypropylene glycol mono(meth) acrylate, and poly(ethylene glycol-propylene glycol) mono (meth)acrylate; and polyvalent alcohol monoesters of unsaturated acids such as glycerol mono(meth)acrylate. Of these, hydroxy alkyl esters of unsaturated acids are preferred. Particularly preferred is a group having a structure obtained by addition of 2-hydroxyethyl acrylate or 2-hydroxyethyl methacrylate to a cyclized product of the conjugated diene polymer.

Other examples of the vinyl compound having a polar group may include methyl (meth)acrylate, ethyl (meth)acrylate, butyl (meth)acrylate, glycidyl (meth)acrylate, dimethylaminoethyl (meth)acrylate, dimethylaminopropyl (meth) acrylate, (meth) acrylamide, and (meth) acrylonitrile.

No particular limitation is imposed on the amount of the polar group in the modified cyclized product of the conjugated diene polymer, particularly in the cyclized product of the conjugated diene polymer containing a polar group. The amount of the polar group is usually in the range of 0.1 to 15 percent by mole, preferably in the range of 0.5 to 10 percent by mole, and more preferably in the range of 1 to 7 percent by mole. The function of absorbing oxygen tends to decrease when this amount is too large or too small. The amount of the polar group is defined such that the amount corresponding to the molecular weight of the polar group bonded to a molecule of the modified cyclized product of the conjugated diene polymer is set to 1 mole.

Examples of the method for producing the modified cyclized product of the conjugated diene polymer may include: (1) a method in which the cyclized product of the conjugated diene polymer obtained by the aforementioned method is subjected to an addition reaction with a polar group-containing vinyl compound; (2) a method in which a conjugated diene polymer containing a polar group is subjected to a cyclization reaction using the aforementioned method; (3) a method in which a conjugated diene polymer containing no polar group is subjected to an addition reaction with a vinyl compound containing a polar group and then the reaction product is subjected to a cyclization reaction; and (4) a method in which the product obtained by the method (2) or (3) is further subjected to an addition reaction with a polar group-containing vinyl compound. Of these, the method (1) is preferred since thereby the unsaturated bond reduction ratio can be easily adjusted.

No particular limitation is imposed on the polar group-containing vinyl compound, so long as the compound can introduce the polar group into the cyclized product of the conjugated diene polymer. Preferred examples of the polar group-containing vinyl compound may include vinyl compounds containing any of polar groups such as acid anhydride, carboxyl, hydroxyl, thiol, ester, epoxy, amino, amide, cyano, and silyl groups and halogens.

Examples of the vinyl compound containing an acid anhydride or carboxyl group may include maleic anhydride, itaconic anhydride, aconitic anhydride, norbornene dicarboxylic anhydride, acrylic acid, methacrylic acid, and maleic acid. Of these, maleic anhydride may be preferably used in terms of reactivity and economical efficiency. Preferred examples of the vinyl compound containing a hydroxyl group may include hydroxy alkyl esters of unsaturated acids, and particularly preferred examples thereof may be 2-hydroxyethyl acrylate and 2-hydroxyethyl methacrylate.

No particular limitation is imposed on the method for subjecting a cyclized product of the conjugated diene polymer to an addition reaction with a polar group-containing vinyl compound to introduce the polar group derived from the polar group-containing vinyl compound. Such a reaction may be performed following any of known reaction procedures generally referred to as an ene addition reaction or a graft polymerization reaction. Such an addition reaction is carried out by bringing the cyclized product of the conjugated diene polymer and the polar group-containing vinyl compound into contact with each other to allow them to react with each other.

If necessary, the reaction is performed in the presence of a radical generator. Examples of the radical generator may include peroxides such as di-tert-butyl peroxide, dicumyl peroxide, and benzoyl peroxide, as well as azonitriles such as azobisisobutyronitrile.

The cyclized product of the conjugated diene polymer contains at least two types of unsaturated bonds that are a linear unsaturated bond that the conjugated diene itself originally had, and a cyclic unsaturated bond in a cyclized portion, unless the conjugated diene polymer is cyclized at 100% cyclization ratio. In the cyclized product of the conjugated diene polymer, the cyclic unsaturated bond portion may largely contribute to oxygen absorption, and the linear unsaturated bond portion makes almost no contribution to oxygen absorption. Therefore, it is necessary to employ a cyclized product of the conjugated diene polymer having 30% or more of "unsaturated bond reduction ratio" as the material for an oxygen absorbing member in the luminescent element of the present invention, wherein the ratio is a percentage of the number of unsaturated bonds reduced by the cyclization of the conjugated diene polymer with respect to the number of unsaturated bonds in the conjugated diene polymer. The unsaturated bond reduction ratio of the cyclized product of the conjugated diene polymer is preferably 40 to 75% and more preferably 55 to 70%. Too low unsaturated bond reduction ratio tends to cause poor oxygen absorbing properties. When the unsaturated bond reduction ratio is equal to or less than the upper limit of the aforementioned preferred range, the resulting cyclized product of the conjugated diene polymer becomes less brittle, which facilitates easy production. The low ratio also suppresses gelation during production, whereby the transparency is improved and therefore the product may be used for a variety of use. The unsaturated bond reduction ratio being greater than 50% may give bonding property to the product. It is possible to utilize this property.

The unsaturated bond reduction ratio is an indicator that indicates the degree of reduction in the number of unsaturated bonds in the conjugated diene monomer units in the conjugated diene polymer during the cyclization reaction and is a value determined as follows. In proton NMR ($^1$H-NMR) analysis, the ratio of the peak area for protons directly bonded to double bonds with respect to the peak area for total protons in the conjugated diene monomer units in the conjugated diene polymer is determined before and after the cyclization reaction, and the ratio of reduction is calculated.

In the conjugated diene monomer units in the conjugated diene polymer, let the peak area for total protons before the cyclization reaction be SBT, the peak area for the protons directly bonded to double bonds before the cyclization reaction be SBU, the peak area for total protons after the cyclization reaction be SAT, and the peak area for the protons directly bonded to double bonds after the cyclization reaction be SAU. Then the ratio of the peak areas for the protons directly bonded to double bonds before the cyclization reaction (SB) is represented by SB=SBU/SBT, and the ratio of the peak areas for the protons directly bonded to double bonds after the cyclization reaction (SA) is represented by SA=SAU/SAT. Therefore, the unsaturated bond reduction ratio is determined by Unsaturated bond reduction ratio (%)=100×(*SB*−*SA*)/ *SB*.

The oxygen absorption capacity of the cyclized product of the conjugated diene polymer for use in the present invention is 5 ml/g or more, preferably 10 ml/g or more, and more preferably 50 ml/g or more. The oxygen absorption capacity is the amount of oxygen absorbed by 1 g of the cyclized product of the conjugated diene polymer at the saturated state after powders or a thin film of the cyclized conjugated diene polymer sufficiently absorbs oxygen at 23° C. If the oxygen absorption capacity is low, a large amount of the cyclized conjugated diene polymer is required for absorbing oxygen in a stable manner for a long period of time. The oxygen absorption capacity has a correlation mainly with the unsaturated bond reduction ratio of the cyclized product of the conjugated diene polymer.

In the present invention, the rate of oxygen absorption by the cyclized product of the conjugated diene on its surface is 1.0 ml/m$^2$-day or more, preferable 5.0 ml/m$^2$-day or more, and more preferably 10 ml/m$^2$-day or more. Even when the cyclized product of the conjugated diene polymer has a large oxygen absorption capacity, too low oxygen absorption rate may result in insufficient absorption of oxygen coming from the outside and undesirable passage of oxygen through the layer. When the cyclized product of the conjugated diene polymer is used as the sealing layer for the luminescent element, oxygen that is present in the sealed space or enters therein for some reason must be promptly absorbed into the cyclized product of the conjugated diene polymer layer and removed. Also from the aforementioned point of view, a cyclized conjugated diene polymer having the aforementioned oxygen absorption rate is preferred.

The containing ratio of the cyclized product of the conjugated diene polymer contained in the adhesive resin is usually 5 to 90 percent by weight and preferably 15 to 70 percent by weight. If the amount of the cyclized conjugated diene polymer is less than the aforementioned lower limit, the oxygen absorption ability and adhesion at room temperature (25° C.) may become insufficient. If the amount exceeds the aforementioned upper limit, the mechanical properties may become insufficient.

The aforementioned alicyclic olefin resin is an amorphous resin having, in its main chain and/or side chain, an alicyclic structure such as a cycloalkane structure or a cycloalkene structure. It is preferable, from the viewpoint of mechanical properties and heat resistance, to use a polymer having an alicyclic structure in its main chain. Examples of the alicyclic structure may include a monocyclic structure and polycyclic structures (such as a condensed polycyclic structure and a cross-linked ring structure). Of the alicyclic structures, a cycloalkane structure is preferred. No particular limitation is imposed on the number of carbon atoms constituting one alicyclic structure unit. The number of carbon atoms is usually 4 to 30, preferably 5 to 20, and more preferably 5 to 15. When the number of carbon atoms is in the aforementioned ranges, the characteristics such as mechanical properties, heat resistance, and formability are preferably well-balanced. Specific examples of the alicyclic olefin resin may include: (1) norbornene polymers; (2) polymers of monocyclic olefins; (3) polymers of cyclic conjugated dienes; and (4) vinyl alicyclic hydrocarbon polymers; and mixtures thereof. Of these, norbornene polymers and vinyl alicyclic hydrocarbon polymers are preferred in terms of their optical properties, heat resistance, and mechanical properties. When an alicyclic olefin resin having a polar group is used as the alicyclic olefin resin, the affinity to an inorganic compound can be improved without loss of light transmittance.

No particular limitation is imposed on the method for forming the sealing layer 131. The sealing layer 131 may be formed by providing a layer of adhesive resin such as the aforementioned ones on the sealing substrate 102 and/or the second transparent electrode layer 112, laminating the sealing substrate 102 and the second transparent electrode layer 112 via the layer of the adhesive resin, and, if necessary, applying heat to cause melt adhesion. The thickness of the sealing layer may be 1 to 1,000 μm.

Usually, such an adhesive resin itself does not have an ability to block water and oxygen in the air, and the outside air may be blocked by the substrate 101 and the sealing substrate 102. However, when a material that can absorb oxygen and water is used as the material for the sealing layer 131 sealed between the substrate 101 and the sealing substrate 102, the luminescent layer 120 can be more effectively prevented from being degraded, and a longer-life light source device can be provided.

(Reflecting Layer)

The light source device of the present invention includes a reflecting layer having a specific concavo-convex structure (a reflecting layer-concavo-convex structure). As a specific example shown in FIG. 1, the reflecting layer having such a concavo-convex structure may be constituted by providing the concavo-convex structure 141 on the upper surface of the reflecting substrate 140 and then forming thereon the reflecting layer 142 with a uniform thickness.

Examples of the materials for forming the reflecting substrate 140 may be the same as the examples of the materials for forming the substrate 101 and the sealing substrate 102. However, a plastic substrate is preferred because thereby the concavo-convex structure 141 can be formed easily. More specifically, the substrate 140 may be made of a material such as the aforementioned alicyclic olefin resin. As the material for the reflecting layer 142, a metal such as aluminum or silver may be used. More specifically, the reflecting layer may be provided by forming one or a plurality of layers made of the metal on the reflecting substrate. For the purpose of improving adhesion properties, corrosion resistance, and abrasion resistance, the reflecting layer may have a structure in which a functional layer such as an inorganic thin film or an organic thin film is provided on the surface of the metal layer. With such a structure, a reflecting layer having a desired concavo-convex structure can be easily obtained. In particular, when the reflecting layer 142 is made of a metal, not only the sealing substrate 102 but also the reflecting layer 142 may play a role of preventing intrusion of oxygen and water in the air into the luminescent element, and the reflectivity of the reflecting substrate can be further increased.

(Concavo-Convex Structure of Reflecting Layer)

In the present invention, the average inclination angle of the concavo-convex structure of the reflecting layer is 12 to 45°. The average inclination angle is an average value of the angles formed by the concavo-convex surface and a horizontal plane in the light source device.

Figure 17:
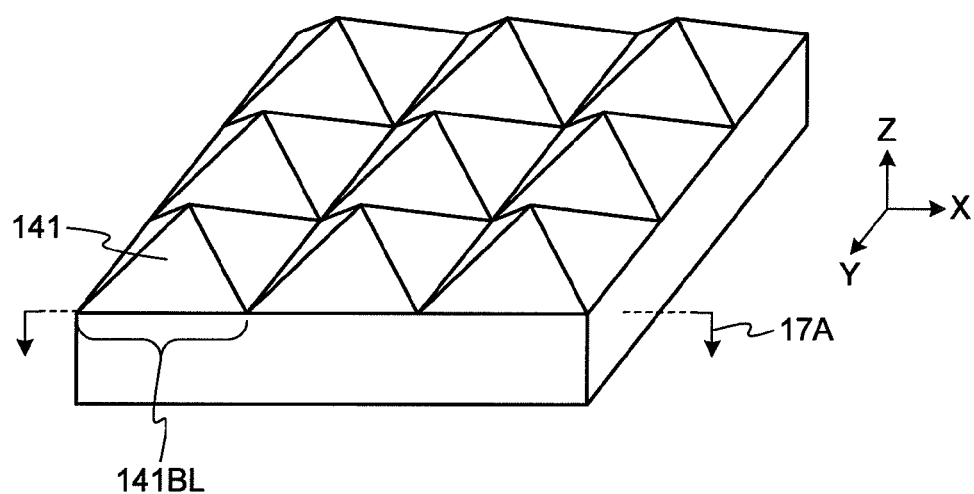
FIG. 17 is a partial perspective view illustrating in more detail the shape of the concavo-convex structure 141 in the organic EL light source device shown in FIG. 1.
Figure 18:
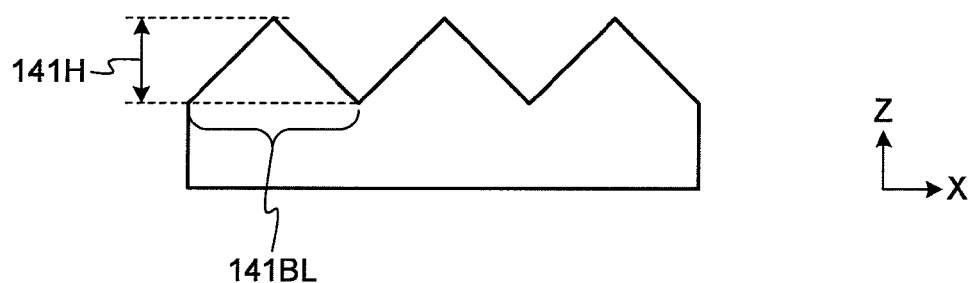
FIG. 18 is a cross-sectional view of the concavo-convex structure 141 shown in FIG. 17, taken along a plane extending along line 17A.

Referring to FIGS. 17 and 18, the average inclination angle of the concavo-convex structure will be described by way of the exemplary concavo-convex structure in the present embodiment. FIG. 17 is a perspective view illustrating a part of the reflecting layer 142 in the present embodiment shown in FIG. 1. FIG. 18 is a vertical cross-sectional view of the reflecting layer shown in FIG. 17, taken along a plane extending along line 17A.

As shown in FIGS. 17 and 18, the concavo-convex structure 141 are of regular quadrangular pyramids. When, for example, each bottom surface of the concavo-convex structure 141 has a square shape having edges 141BL each of which has a length of 0.1 mm and its height 141H is 0.05 mm, all the four inclined faces are angled at 45° with respect to a plane direction of the substrate. In this case, the average inclination angle of this reflecting layer is 45°.

When the concavo-convex structure is composed of more complex polyhedra or curved surfaces, the average inclination angle is defined as follows. That is, the concavo-convex surface is divided into n small areas sufficiently smaller than the area of the concavo-convex structure unit. Let the small areas be ΔSi, and the angles between ΔSi and a substrate plane be θi. Then the average inclination angle is defined as:

$$\text{Average inclination angle} = \sum_{i=0}^{n} (\Delta Si \times |\theta i|) \Big/ \sum_{i=0}^{n} \Delta Si$$

Here, ΣΔSi is the total surface area of the reflecting layer. In the light source device of the present invention, the average inclination angle of the reflecting layer defined above is 12 to 45°, whereby high light extraction efficiency can be realized.

(Bonding Layer)

As the material for forming the bonding layer 132 for bonding the sealing substrate 102 and the reflecting layer 142 in the first embodiment, any materials that are the same as the resins exemplified as the materials for the sealing layer 131 may be used. However, the material is not limited thereto but may be any of a variety of known adhesives used for bonding optical members. Specifically, Aron Alpha (registered trademark, product of Toagosei Co., Ltd.) may be used.

No particular limitation is imposed on the method for forming the bonding layer 132. The bonding layer 132 may be formed by coating the surface of the sealing substrate 102 and/or the surface of the reflecting layer 142 with a composition for forming the bonding layer, laminating the sealing substrate 102 and the reflecting layer 142 via the coating layer of the composition, and, if necessary, performing treatments such as photo-curing, heating, and drying. The thickness of the bonding layer may be 1 to 1,000 μm.

In the organic EL light source device of the present embodiment, the luminescent layer 121 emits light when a voltage is applied between the first transparent electrode layer 111 and the second transparent electrode layer 112. Part of the generated light passes through the first transparent electrode layer 111 and then through the substrate 101 and is emitted from a light-emitting surface 100A. The rest of the generated light may take a variety of paths. For example, a portion of the light passes through the second transparent electrode layer 112, the sealing layer 131, the sealing substrate 102 and the bonding layer 132 to reach the reflecting layer 142, which is then reflected by the reflecting layer 142 and travels along an upward path, to be emitted from the light-emitting surface 100A. The light may be reflected not only at the boundary between the reflecting layer 142 and the bonding layer 132 but also at other boundaries between the layers that are the substrate 101, the bonding layer 132 and other layers disposed therebetween. The light reflected at the boundaries between the layers, which are the substrate 101, the bonding layer 132 and other layers disposed therebetween, then proceeds downward and reaches the inclined surfaces of the reflecting layer 142, where the traveling direction of the light is altered and the light is then emitted. When the reflecting layer 142 has such an uneven surface which renders the distance between the light-emitting layer 121 and the reflecting layer being uneven and which causes a diffusive reflection effect, interference of light is suppressed and the light extraction efficiency is thereby improved.

(Second Embodiment)

Figure 4:
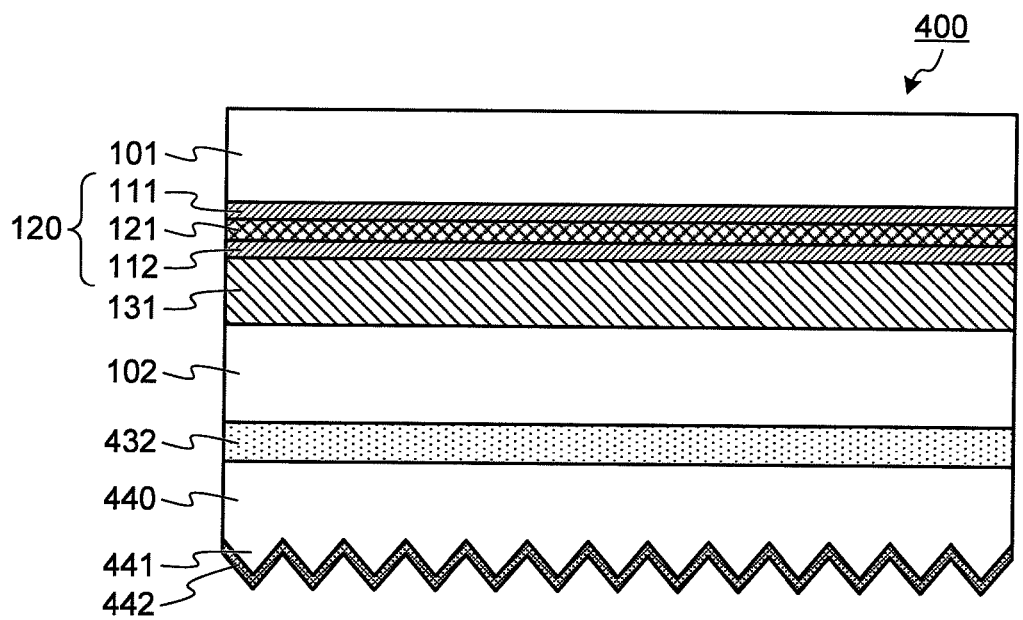
FIG. 4 is a vertical cross-sectional view schematically illustrating an organic EL light source device according to another embodiment of the present invention.

FIG. 4 is a vertical cross-sectional view illustrating the layer configuration of an organic EL light source device according to a second embodiment of the present invention. The device 400 shown in FIG. 4 is different from the device in the first embodiment in that the device 400 includes: a transparent concavo-convex layer 440 provided on the lower side of the sealing substrate 102 via a bonding layer 432; a concavo-convex structure 441 provided on the lower surface of the transparent concavo-convex layer 440; and a reflecting layer 442 provided on the lower surface of the concavo-convex structure 441. In the present embodiment shown in FIG. 4, since the reflecting layer 442 is provided along the concavo-convex structure 441 of the transparent concavo-convex layer 440, the reflecting layer 442 may thereby have a specific concavo-convex structure that is specified in the present invention. Therefore, such a configuration can also achieve an improved light extraction efficiency with satisfying the requirements of the present invention, to achieve the desired effects.

Examples of the material for forming the transparent concavo-convex layer may be the same as those of the materials for forming the substrate 101 and the sealing substrate 102. A plastic substrate is preferred because the concavo-convex structure 441 can be easily formed therewith. More specifically, a material made of, e.g., the aforementioned alicyclic olefin resin may be used.

(Third Embodiment)

Figure 5:
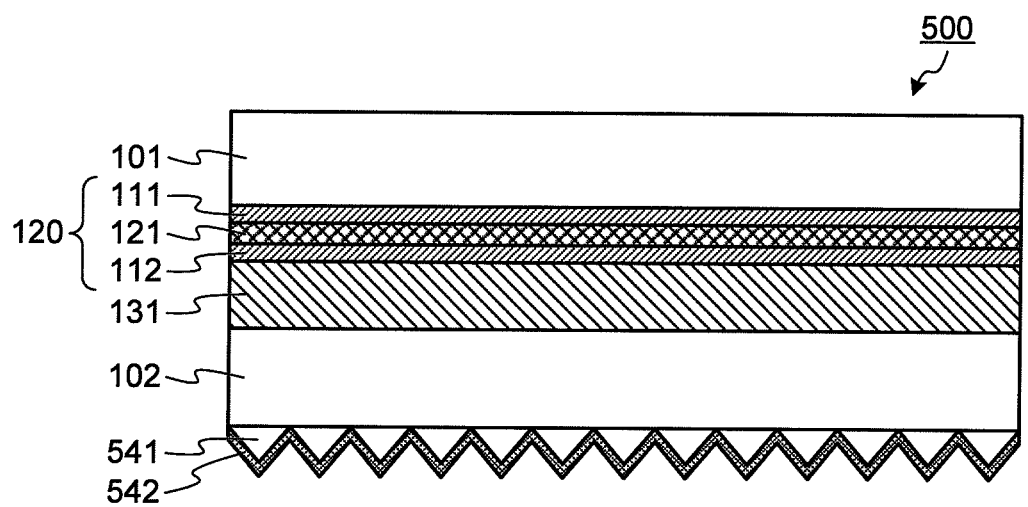
FIG. 5 is a vertical cross-sectional view schematically illustrating an organic EL light source device according to yet another embodiment of the present invention.

FIG. 5 is a vertical cross-sectional view illustrating the layer configuration of an organic EL light source device according to a third embodiment of the present invention. The present embodiment is a further modification of the second embodiment shown in FIG. 4. The device 500 shown in FIG. 5 is different from the device in the second embodiment in that the device 500 includes: concavo-convex structure 541 made of a transparent resin and provided directly on the lower surface of the sealing substrate 102 without a boding layer interposed therebetween; and a reflecting layer 542 provided along the concavo-convex structure 541. Also with this configuration, the reflecting layer 542 is configured to have the concavo-convex structure specified in the present invention. Therefore, the light extraction efficiency can be improved with satisfying the requirements of the present invention, to achieve the desired effects.

(Fourth Embodiment)

Figure 6:
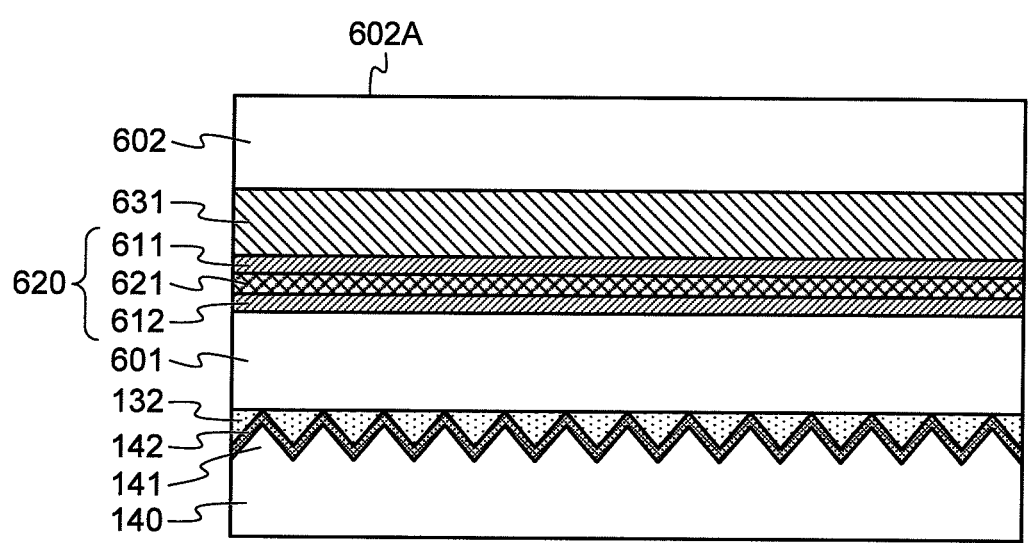
FIG. 6 is a vertical cross-sectional view schematically illustrating an organic EL light source device according to yet another embodiment of the present invention.

FIG. 6 is a vertical cross-sectional view illustrating the layer configuration of an organic EL light source device according to a fourth embodiment of the present invention. As shown in FIG. 6, the light source device 600 of the present embodiment includes: a luminescent element 620 formed by stacking a second transparent electrode layer 612, a luminescent layer 621, and a first transparent electrode layer 611 in that order on a substrate 601; and a sealing substrate 602 provided on the luminescent element 620 via a sealing layer 631. As in the first embodiment, on the lower surface of the substrate 601 of the light source device of the present embodiment, the reflecting layer 142 on the concavo-convex structure 141 on the upper surface of the reflecting substrate 140 is provided via the bonding layer 132. In the present embodiment, the upper surface 602A of the sealing substrate 602 serves as the light-emitting surface of the light source device. In the aforementioned configuration, light is emitted from the surface 602A of the sealing substrate 602 that is disposed on the side opposite to the substrate 601 on which the luminescent element is formed. With this configuration, the requirement of having the first electrode layer, the luminescent layer, the second electrode layer, and the specific reflecting layer in that order can be satisfied. Therefore, with satisfying the requirements of the present invention, the light extraction efficiency can be improved, and the desired effects can be obtained.

(Fifth Embodiment)

Figure 7:
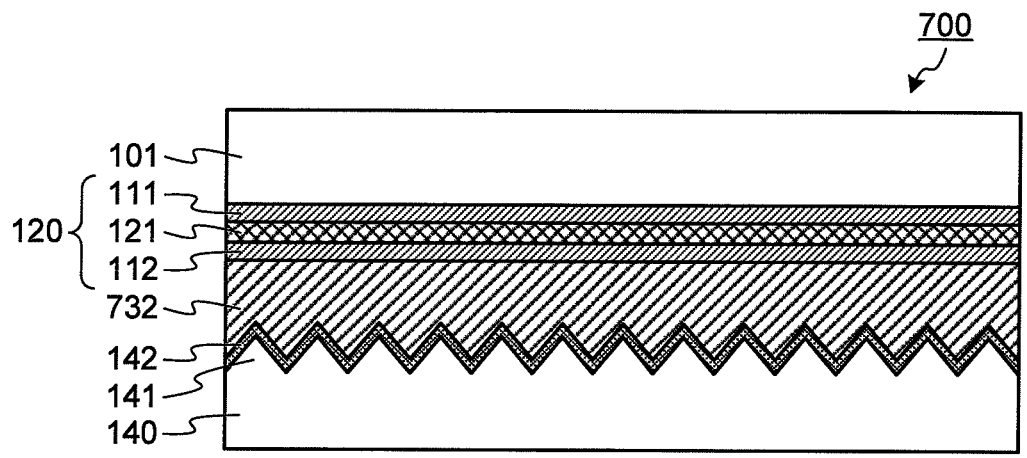
FIG. 7 is a vertical cross-sectional view schematically illustrating an organic EL light source device according to yet another embodiment of the present invention.

FIG. 7 is a vertical cross-sectional view illustrating the layer configuration of an organic EL light source device according to a fifth embodiment of the present invention. The present embodiment is a modification of the first embodiment shown in FIG. 1. The device 700 shown in FIG. 7 is different from the device in the first embodiment in that, in place of the sealing layer 131, the sealing substrate 102, and the bonding layer 132, a sealing bonding layer 732 is provided on the lower side of the second transparent electrode layer 112. More specifically, in the present embodiment, the sealing bonding layer 732 is in direct contact with the second transparent electrode layer 112 and also with the reflecting layer 142. In this configuration, the reflecting layer 142, in place of the sealing substrate 102, blocks oxygen, water, etc. in the air from entering the luminescent element 120 (the first transparent electrode layer 111, the luminescent layer 121, and the second transparent electrode layer 112). Therefore, the degradation of the luminescent element 120 can be prevented using a simpler layer configuration, and a thin and long-life light source device can be obtained at low cost.

In the present embodiment, the reflecting layer 142 functions as a barrier for blocking oxygen, water, etc. in the air. In this case, it is preferable that the material for forming the reflecting layer 142 includes a layer of a metal such as aluminum or silver. This metal layer may be a single layer made of one species of metal or may include a plurality of layers. When the reflecting layer consists of a plurality of layers, these layers constituting the reflecting layer may be formed of the same metal or may be formed of different metals. The reflecting layer may be formed by stacking a metal layer and a functional layer such as an inorganic thin film or an organic thin film. The thickness of the reflecting layer 142 is preferably 0.1 to 10 μm from the viewpoint of ensuring reflecting property and barrier property. Generally, when an organic EL luminescent element is shielded by a metal film, the metal film is often required to have barrier properties equivalent to or better than those of an aluminum single layer film having a thickness of 30 μm or more. In the present invention, however, appropriate selection of the sealing bonding layer and the reflecting substrate can achieve high barrier properties even though an easily produceable thin metal reflecting film is used. Although not shown in the drawing, materials used as a sealing layer, such as inert liquids such as fluorinated hydrocarbons and silicon oil, as well as liquid crystal materials such as nematic liquid crystal and smectic liquid crystal materials, may also be used in place of the sealing bonding layer 732. When a liquid crystal material is used, the layer configuration may have the optical axis of the liquid crystal aligned in one direction or a plurality of directions, or may have a plurality of randomely-formed domains. In this manner, the light extraction efficiency can be improved. When such a material having high flowability is used, the concavo-convex structure of the reflecting layer can be easily filled with the sealing layer.

(Sixth Embodiment)

Figure 8:
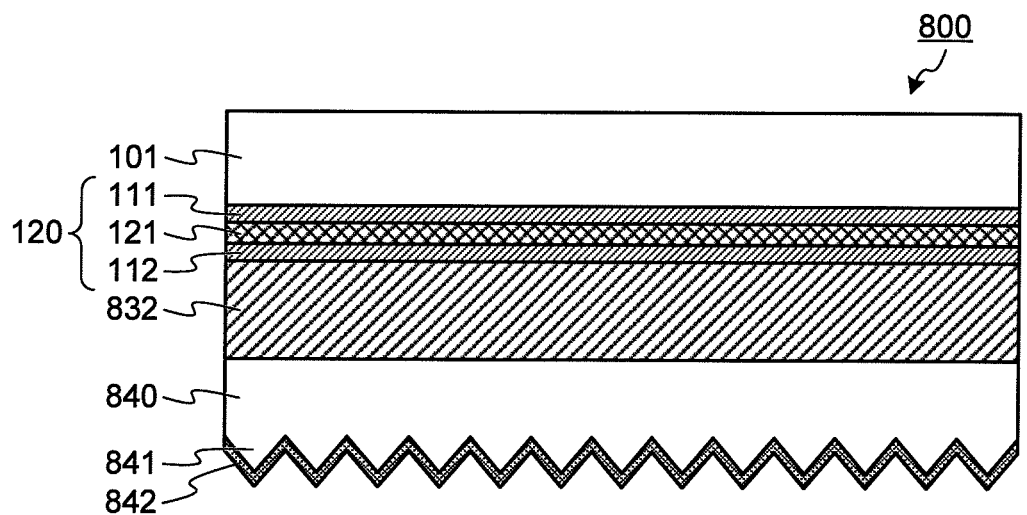
FIG. 8 is a vertical cross-sectional view schematically illustrating an organic EL light source device according to yet another embodiment of the present invention.

FIG. 8 is a vertical cross-sectional view illustrating the layer configuration of an organic EL light source device according to a sixth embodiment of the present invention. The present embodiment is a further modification of the fifth embodiment shown in FIG. 7. The device 800 shown in FIG. 8 is different from the device in the fifth embodiment in that the device 800 includes: a transparent concavo-convex layer 840 provided on the lower side of the second transparent electrode layer 112 via a sealing bonding layer 832, the transparent concavo-convex layer 840 having a concavo-convex structure 841 on its lower surface; and a reflecting layer 842 provided on the lower surface of the concavo-convex structure 841 formed on the lower surface of the transparent concavo-convex layer 840. In the present embodiment shown in FIG. 8, since the reflecting layer 842 is provided along the concavo-convex structure of the transparent concavo-convex layer 840, the reflecting layer 842 is configured to have the specific concavo-convex structure specified in the present invention. Further, as in the fifth embodiment, the reflecting layer can block oxygen, water, etc, in the air from entering the luminescent element. Therefore, with this configuration, the light extraction efficiency can be improved, and a thin and long-life light source device can be obtained at low cost.

(Seventh Embodiment)

Figure 9:
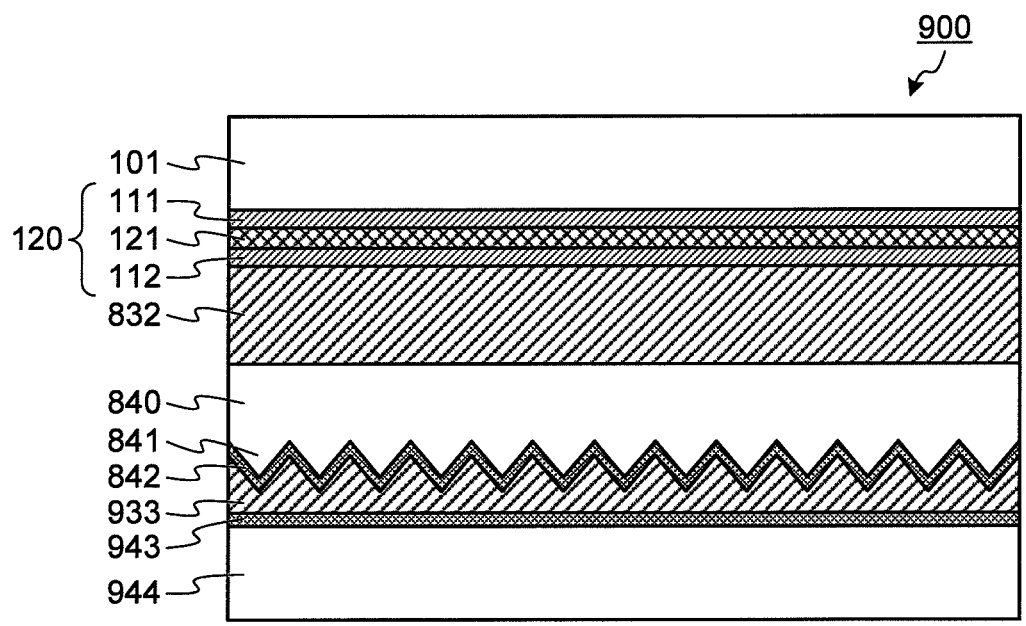
FIG. 9 is a vertical cross-sectional view schematically illustrating an organic EL light source device according to yet another embodiment of the present invention.

FIG. 9 is a vertical cross-sectional view illustrating the layer configuration of an organic EL light source device according to a seventh embodiment of the present invention. The present embodiment is a further modification of the sixth embodiment shown in FIG. 8. The device 900 shown in FIG. 9 is different from the device in the sixth embodiment in that the device 900 includes: a sealing metal layer 943 provided on the lower side of the reflecting layer 842 via a sealing layer 933; and a substrate 944 for the sealing metal layer 943. The material for forming the reflecting layer 842 and the material for forming the metal layer 943 may be the same or different, and the thicknesses of these layers may also be the same or different. In the present embodiment shown in FIG. 9, the metal layer 943 is further provided in addition to the reflecting layer 842. By such a configuration, even when a layer having high reflecting properties but poor sealing properties is used as the reflecting layer 842, the use of a layer having high sealing properties as the metal layer 943 can further improve the reflecting properties than those in the sixth embodiment, irrespective of the reflecting properties of the metal layer, and simultaneously oxygen, water, etc. in the air can also be blocked from entering the luminescent element in a better manner. Therefore, with this configuration, the light extraction efficiency can be improved, and a thin and long-life light source device can be obtained at low cost.

(Eighth Embodiment)

Figure 10:
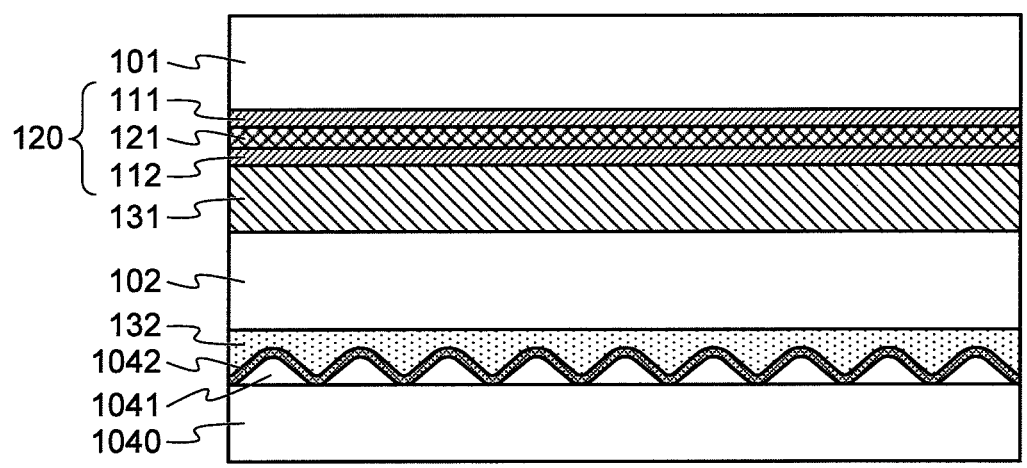
FIG. 10 is a vertical cross-sectional view schematically illustrating an organic EL light source device according to yet another embodiment of the present invention.

FIG. 10 is a vertical cross-sectional view illustrating the layer configuration of an organic EL light source device according to an eighth embodiment of the present invention. The present embodiment is still another modification of the first embodiment shown in FIG. 1. The device 1000 shown in FIG. 10 is different from the device in the first embodiment in that a reflecting substrate 1040 including a concavo-convex structure 1041 having curved surfaces is used as the reflecting substrate and that a reflecting layer 1042 with a uniform thickness is formed on the reflecting substrate 1040, thereby being provided with a concavo-convex structure having curved surfaces as the reflecting layer. In the present embodiment shown in FIG. 10, since the concavo-convex structure 1041 is provided, the reflection directions are more scattered than those with a concavo-convex structure composed only of flat surfaces, and the light extraction efficiency is thereby further improved. In addition, when a viewer observes the light-emitting surface, reflections of objects located closer to the viewer than the light-emitting surface can be prevented.

(Ninth Embodiment)

Figure 11:
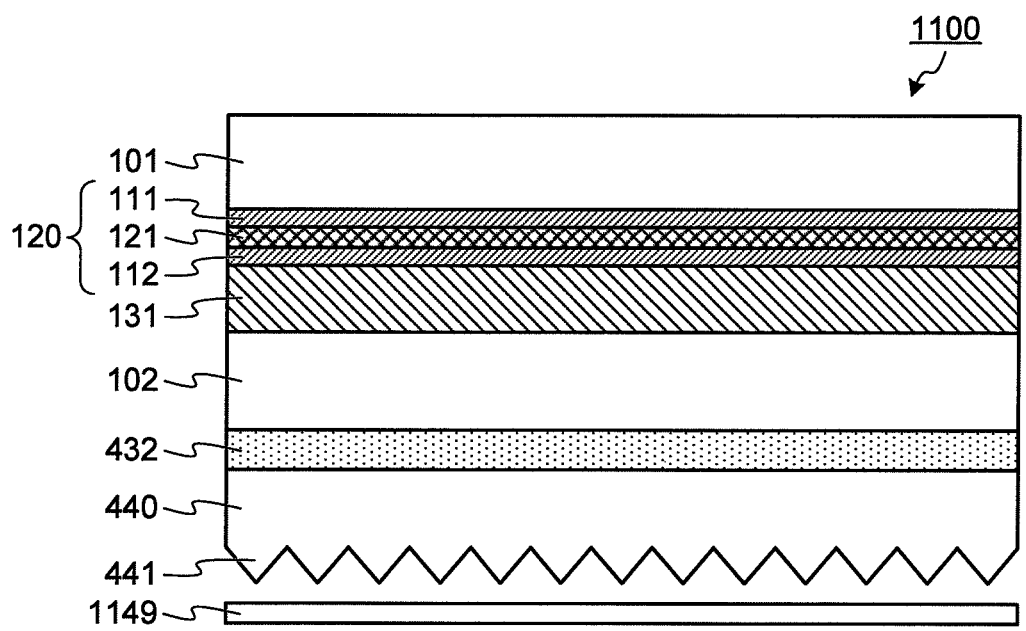
FIG. 11 is a vertical cross-sectional view schematically illustrating an organic EL light source device according to yet another embodiment of the present invention.

FIG. 11 is a vertical cross-sectional view illustrating the layer configuration of an organic EL light source device according to a ninth embodiment of the present invention. The present embodiment is still another modification of the second embodiment shown in FIG. 4. The device 1100 shown in FIG. 11 is different from the device in the second embodiment in that a flat reflecting-scattering layer 1149 is provided in place of the reflecting layer 442 used in the second embodiment. The reflecting-scattering layer 1149 is provided so as to be spaced apart from the transparent concavo-convex layer 440. Employing such a configuration, the transparent concavo-convex layer 440 and the reflecting-scattering layer 1149 are disposed with an air layer interposed therebetween. When a combination of the transparent concavo-convex layer having the specific concavo-convex structure and the reflecting-scattering layer is used in place of the reflecting layer having the specific concavo-convex structure, high extraction efficiency can also be achieved.

The transparent concavo-convex layer having the specific concavo-convex structure acts as a diffusing layer for scattering light by refraction in the concavo-convex structure when the light is emitted from the surface having the concavo-convex structure 441 and when the light reflected from the reflecting-scattering layer 1149 is incident on the surface having the concavo-convex structure 441. When the average inclination angle of the surfaces that form the concavo-convex structure of the diffusing layer is 17 to 45°, particularly high light extraction efficiency can be achieved.

As the reflecting-scattering layer for the present embodiment, a white layer that causes Lambert scattering and reflection of incident light may be preferably used. Specific examples of the material for forming the white layer may include a polyester film that contains small air bubbles generated by stretching the film and has white color resulting from reflection and scattering by the air bubbles (for example, "Lumirror (trade name)," product of TORAY Industries Inc.).

In the present embodiment, the concavo-convex structure of the transparent concavo-convex layer serving as the diffusing layer may have various shapes having average inclination angles of 17 to 45°. For example, this concavo-convex structure may have the same shape as the shape of the concavo-convex structure of the reflecting layer in the first embodiment shown in FIG. 17. In addition, any of various shapes that are shown as examples of the concavo-convex structure of the reflecting layer in the present application and having average inclination angles of 17 to 45° may also be used.

In a further modification of the present embodiment, a light-emitting surface diffusing layer that has, on its light-emitting-side surface, a concavo-convex structure consisting of ridge-shaped units may be provided, as in a tenth embodiment shown in FIG. 14 described later, together with the concavo-convex structure of the transparent concavo-convex layer having a structure consisting of ridge-shaped units similar to the concavo-convex structure of the reflecting layer in the tenth embodiment, wherein the lengthwise direction of the ridges of the light-emitting surface diffusing layer is configured to be orthogonal to the lengthwise direction of the ridges of the concavo-convex structure of the transparent concavo-convex layer. The light diffusing directions may be controlled by a combination of the aforementioned concavo-convex structures. With this configuration, the light diffusing directions and the degree of light diffusion can be adjusted in a more flexible manner by using any suitable combination of easily designed and produced members.

(Tenth Embodiment)

Figure 14:
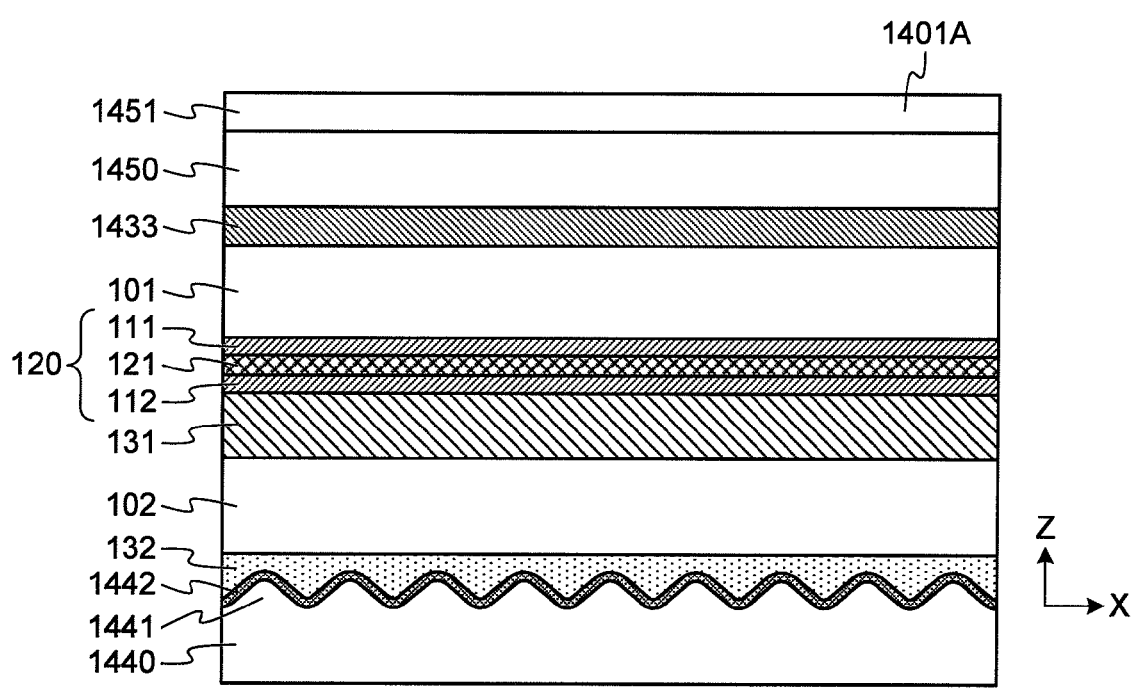
FIG. 14 is a vertical cross-sectional view schematically illustrating an organic EL light source device according to yet another embodiment of the present invention.

FIG. 14 is a vertical cross-sectional view illustrating the layer configuration of an organic EL light source device according to the tenth embodiment of the present invention. The present embodiment is still another modification of the first embodiment shown in FIG. 1. The device 1400 shown in FIG. 14 is different from the device in the first embodiment in that the device 1400 includes: as the reflecting substrate, a reflecting substrate 1440 having on its upper surface a concavo-convex structure 1441 with curved surfaces; and a reflecting layer 1442 with a uniform thickness that is formed on the upper surface of the concavo-convex structure 1441, so that the reflecting layer has a concavo-convex structure with curved surfaces. Another difference is that a light-emitting surface diffusing layer 1450 having a concavo-convex structure 1451 is provided on the light-emitting-side surface of the substrate 101 via a bonding layer 1433.

Figure 15:
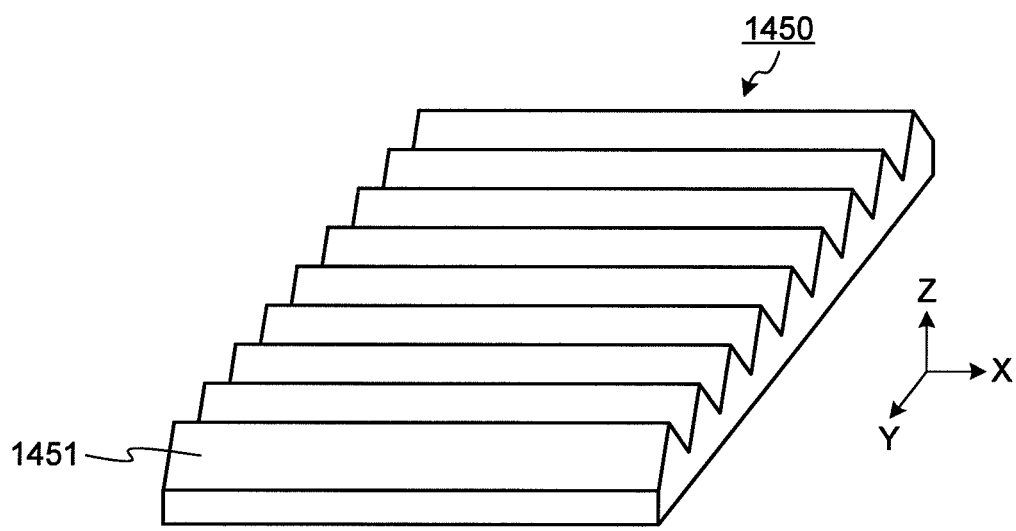
FIG. 15 is a perspective view illustrating in more detail the shape of the light-emitting surface diffusing layer 1450 in the organic EL light source device shown in FIG. 14.
Figure 20:
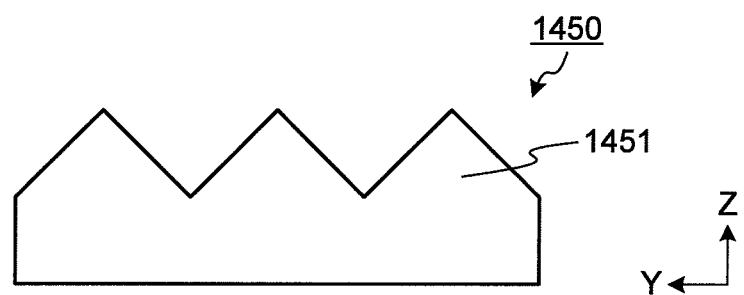
FIG. 20 is a partial cross-sectional view illustrating in more detail the shape of the light-emitting surface diffusing layer 1450 shown in FIG. 15.

As shown in FIG. 15, the light-emitting surface diffusing layer 1450 has the concavo-convex structure 1451 on its light-emitting surface. The concavo-convex structure 1451 has a plurality of constitution units. Each constitution unit is a ridge-shaped unit having a triangular prism shape. The lengthwise direction of each constitution unit extends along the direction of X-axis of the coordinate system shown in FIG. 15 (i.e., the left-right direction in FIG. 14). A large number of the constitution units are continuously arranged in parallel along the direction of Y-axis in the coordinate system (the front-rear direction in FIG. 14) to form a periodic structure. The cross-section of the concavo-convex structure 1451 taken along a plane perpendicular to the lengthwise direction of the constitution units (i.e., a plane parallel to the Y- and Z-axes) has a sawtooth shape formed by continuously arranging triangles, as shown in FIG. 20.

Figure 19:
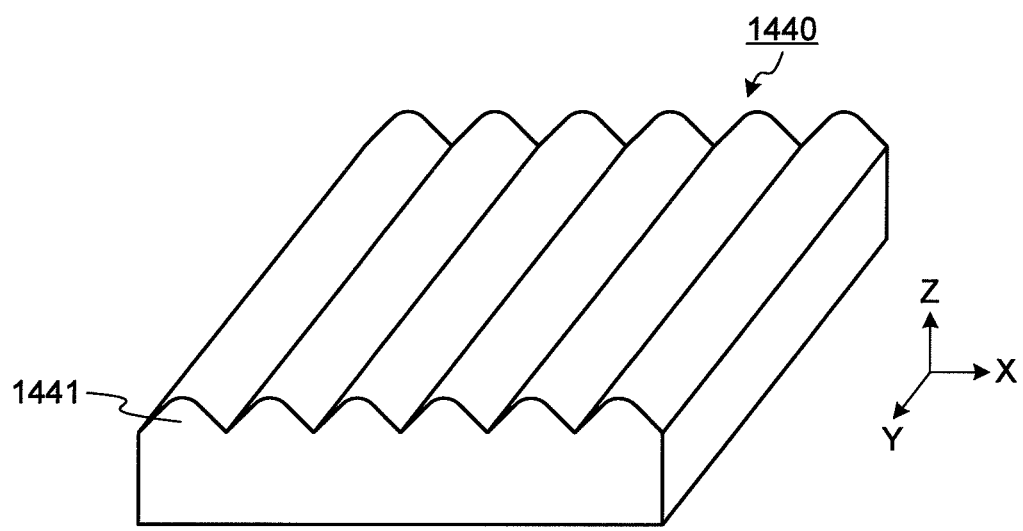
FIG. 19 is a perspective view illustrating in more detail the shape of the concavo-convex structure of a reflecting substrate 1440 in the organic EL light source device shown in FIG. 14.
Figure 21:
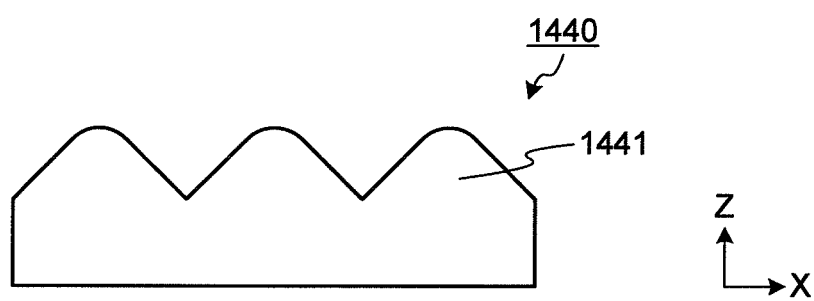
FIG. 21 is a partial cross-sectional view illustrating in more detail the shape of the reflecting substrate 1440 shown in FIG. 19.

As shown in FIG. 19, the reflecting substrate 1440 has the concavo-convex structure 1441 on its upper surface, and the concavo-convex structure of the reflecting layer 1442 is determined by the concavo-convex structure 1441. The concavo-convex structure 1441 has a plurality of constitution units. Each constitution unit is a ridge-shaped unit having a curved shape formed by chamfering one edge of a triangular prism shape. The lengthwise direction of each constitution unit extends along the direction of Y-axis of the coordinate system shown in FIG. 19. A large number of the constitution units are continuously arranged in parallel along the direction of X-axis in the coordinate system to form a periodic structure. The cross-section of the concavo-convex structure 1441 taken along a plane perpendicular to the lengthwise direction of the constitution units (i.e., a plane parallel to the X- and Z-axes) has a wavy shape formed of continuously arranged arc-shapes formed by chamfering the apexes of triangles, as shown in FIG. 21.

That is, in the structure of the device 1400 shown in FIG. 14, the concavo-convex structure of the reflecting layer 1442 and the concavo-convex structure of the diffusing layer 1450 are configured such that the lengthwise directions of their constitution units are orthogonal to each other as viewed from the light-emitting surface (i.e., as viewed in the Z-direction). With this configuration, the light extraction efficiency can be further improved. The concavo-convex structures consisting of ridges are more easily designed and produced than, for example, the pyramid structure shown in FIG. 17. Therefore, by controlling the light diffusing direction using a combination of these structures, the light diffusing directions and the degree of light diffusion can be adjusted in a more flexible manner by using a suitable combination of easily designed and produced members.

In the configuration of the present embodiment, the lengthwise direction of the constitution units constituting the concavo-convex structure 1441 and the lengthwise direction of the constitution units constituting the concavo-convex structure 1451 are orthogonal to each other as viewed from the light-emitting surface (i.e., as viewed in the Z-direction). However, the angle between the intersecting lengthwise directions is not limited thereto and may have various values. The angle is particularly preferably 10° to 90°.

(Other Modifications: Concavo-Convex Structure)

In the embodiments described above, the concavo-convex structures of the reflecting layers have been the periodic structure composed of continuous quadrangular pyramid constitution units shown in FIG. 17 and the periodic structure composed of continuous ridge-shaped constitution units shown in FIG. 19 that have a curved shape formed by chamfering one edge of a triangular prism. However, the concavo-convex structure for the present invention is not limited thereto and may have a variety of shapes so long as the average inclination angle falls within the aforementioned specific range.

More specifically, for example, the ridge-shaped constitution unit shown in FIG. 19 may be replaced with a constitution unit having a shape composed of a part of a prism, circular cylinder, or ellipsoidal cylinder. In such a case, the cross-section of the constitution unit taken along a plane perpendicular to its lengthwise direction is a part of a polygon, circle, or ellipse.

As other examples, the quadrangular pyramid constitution unit shown in FIG. 17 may be replaced with a constitution unit having a shape of a prism or pyramid other than a quadrangular pyramid, a shape having a trapezoidal cross-section and composed of a part of a pyramid, a shape composed of a part of a cone, sphere, or spheroid, or other shape. No particular limitation is imposed on the height of such a concavo-convex structure, but the difference between the highest portion and the lowest portion (for example, the height represented by an arrow 141H in the example shown in FIG. 18) is particularly preferably 0.3 to 100 μm.

As described above, the concavo-convex structure of a reflecting layer may be obtained by molding a reflecting substrate or a transparent concavo-convex layer to form a concavo-convex structure and then forming the reflecting layer with a uniform thickness thereon. In addition to this, the concavo-convex structure may also be obtained by the method described below. That is, it is possible to use a reflecting layer having a concavo-convex structure with a corrugation structure (hereinafter referred to as a "corrugated reflecting layer") obtained by:

forming a thin film on one surface of a reflecting layer film substrate, to obtain a multilayer body; and shrinking the multilayer body in at least one in-plane axial direction to corrugate the thin film. With such a method, a reflecting layer having small concaves and convexes can be easily obtained. Therefore, by using such a corrugated reflecting layer, a light source device having good light extraction efficiency can be obtained at low cost.

(Corrugated Reflecting Layer: Reflecting Layer Film Substrate)

No particular limitation is imposed on the reflecting layer film substrate for producing the corrugated reflecting layer so long as the film substrate is shrinkable in at least one in-plane axial direction after a thin film is stacked thereon. For example, the reflecting layer film substrate may be a film itself having shrinkability upon applying, e.g., heat. The reflecting layer film substrate may also be a film which, when stretched uniaxially, shrinks in a direction orthogonal to the stretching direction.

The average thickness of the reflecting layer film substrate before shrinkage is usually 5 to 1,000 μm and preferably 20 to 200 μm, for facilitating handling.

Usually, the reflecting layer film substrate is formed of resin, rubber, or an elastomer. Examples of the resin may include styrene reins, acrylic resins, methacrylic resins, organic acid vinyl ester reins, vinyl ether resins, halogen-containing resins, olefin resins, resins having an alicyclic structure, polycarbonate resins, polyester resins, polyamide resins, thermoplastic polyurethane resins, polysulfone resins (such as polyethersulfone and polysulfone), polyphenylene ether resins (such as polymers of 2,6-xylenol), cellulose derivatives (such as cellulose esters, cellulose carbamates, and cellulose ethers), and silicone resins (such as polydimethylsiloxane and polymethylphenylsiloxane).

Examples of the resins having an alicyclic structure may include those which have already described. Specific examples among them may include: cyclic olefin random copolymers described in Japanese Patent Application Laid-Open No. Hei 05-310845 and U.S. Pat. No. 5,179,171; hydrogenated polymers described in Japanese Patent Application Laid-Open No. Hei 05-97978 and U.S. Pat. No. 5,202,388; and thermoplastic dicyclopentadiene-based ring-opening polymers and hydrogenated products thereof described in Japanese Patent Application Laid-Open No. Hei 11-124429 and WO99/20676.

Examples of the rubber and elastomer may include diene rubbers such as polybutadiene and polyisoprene, styrene-butadiene copolymers, acrylonitrile-butadiene copolymers, acrylic rubbers, urethane rubbers, and silicone rubbers. Of these, thermoplastic resins are preferred as the material for the reflecting layer film substrate because they are easily produced.

No particular limitation is imposed on the thermoplastic resin for forming the reflecting layer film substrate. However, in order to facilitate processing, the glass transition temperature of the thermoplastic resin is preferably 60 to 200° C. and more preferably 100 to 180° C. The glass transition temperature may be measured by differential scanning calorimetry (DSC).

The weight-average molecular weight as polystyrene equivalent of the thermoplastic resin for forming the reflecting layer film substrate is preferably 5,000 to 500,000, more preferably 8,000 to 200,000, and particularly preferably 10,000 to 100,000. When the weight-average molecular weight falls within this range, the resin can have good moldability and improved mechanical strength. The weight-average molecular weight may be measured by gel permeation chromatography.

The resin, rubber, or elastomer for forming the reflecting layer film substrate may appropriately contain a coloring agent such as a pigment and a dye, a fluorescent brightening agent, a dispersant, a thermal stabilizer, a light stabilizer, an ultraviolet absorber, an antistatic agent, an antioxidant, a chlorine scavenger, a flame retardant, a nucleating agent, an anti-blocking agent, an anti-fogging agent, a release agent, an organic or inorganic filler, a neutralizer, a slip additive, a decomposer, a metal deactivator, a fouling inhibitor, an antibacterial agent, diffusing particles, a thermoplastic elastomer, and other additives.

No particular limitation is imposed on the method for producing the reflecting layer film substrate. The raw material film of the reflecting layer film substrate may be obtained by giving shape to one of the aforementioned resins and other resins using a known film forming method. Examples of the method for forming the reflecting layer film may include casting, extrusion molding, and inflation molding.

In the reflecting layer film substrate that itself is shrinkable by means such as heating, it is usually preferable that its molecules are oriented in a plane. Intrinsically, molecules tend to arrange themselves in a low-energy orientation state in accordance with their interatomic bonding angle. In the state in which molecules are oriented in a plane, distortion is present in the bonding state of the molecules, and the molecules are in a high-energy orientation state. When a reflecting layer film substrate in such a high-energy state is, for example, heated, the molecules tend to return to a low-energy orientation state, and the reflecting layer film substrate as a whole thereby shrinks. The molecular orientation state may be measured by a known method. For example, an automatic birefringence meter (KOBRA21ADH) may be used for the measurement.

The reflecting layer film substrate that itself is shrinkable by means such as heating may be obtained by, for example, giving a shape of a raw material film to any of the resins described above and other resins using a known forming method, and then stretching the raw material film. In place of the stretching processing, orientation of the molecules may be performed by application of magnetic or electric field or rubbing processing, to obtain a shrinkable film substrate. A film substrate having shrinkability due to elastic restoring force may be obtained by giving a shape of an elastic film to an elastomer or rubber by a known forming method and then keeping the elastic film in a stretched state in in-plane direction. Another film substrate may be obtained by previously swelling a film made of a curable resin with, for example, a solvent. With this film substrate, shrinkage of the swollen film during drying is utilized. Among the aforementioned film substrates, the shrinkable film substrate obtained by stretching a raw material film is preferred.

As to the shrinkable reflecting layer film substrate obtained by stretching a raw material film, no particular limitation is imposed on the method for stretching the film. The stretching may be uniaxial stretching or biaxial stretching. When biaxial stretching is used, the film is shrunk in two directions in the plane of the film. Examples of the stretching method may include: a uniaxial stretching method in a longitudinal direction by utilizing the difference in peripheral velocity between rolls; a uniaxial stretching method in a lateral direction using a tenter stretcher; and biaxial stretching methods such as a simultaneous biaxial stretching method in which longitudinal stretching is performed by increasing the distance between clips securing the raw material film while simultaneously lateral stretching is performed by utilizing the spreading angle of guide rails and a sequential biaxial stretching method in which longitudinal stretching is performed by utilizing the difference in peripheral velocity between rolls and then lateral stretching is performed using a tenter stretcher with opposite edges of the film held by clips.

If the shrinkage ratio in a principal shrinkage direction is extremely high, elongation in a direction orthogonal to the principal shrinkage direction may occur, and this may cause cracks in the concavo-convex shape. For suppressing the occurrence of cracks during shrinkage, it is preferable to use (i) a lateral uniaxial stretching method in which uniaxial stretching is performed in a lateral direction while shrinkage in a longitudinal direction during stretching is suppressed to preferably 20% or less and more preferably 15% or less or (ii) a biaxial stretching method in which biaxial stretching is performed in longitudinal and lateral directions.

Examples of the apparatus used for stretching may include a longitudinal uniaxial stretcher, a tenter stretcher, a bubble stretcher, and a roller stretcher.

The temperature during stretching is selected from temperatures preferably between (Tg−30° C.) and (Tg+60° C.) and more preferably between (Tg−10° C.) and (Tg+50° C.), where Tg is the glass transition temperature of the material for forming the reflecting layer film substrate. The stretching ratio is appropriately selected in accordance with the stretching characteristics of the film used such that the concaves and convexes have the desired size.

When high level difference between concaves and convexes is desired, the stretching ratio is generally set to a large value, although this depends on the properties and thickness of the thin film. When low level difference between the concaves and convexes is desired, the stretching ratio is set to a small value. For example, the stretching ratio in the principal stretching direction is usually 1.01 to 30, preferably 1.01 to 10, and more preferably 1.05 to 5. If the stretching ratio is less than 1.01, a concavo-convex shape may not be formed. If the stretching ratio is greater than 30, the film strength may be reduced. Therefore, the stretching ratio may be set within the aforementioned preferred range.

(Corrugated Reflecting Layer: Thin Film)

Preferably, the average thickness of the thin film before shrinkage is 1 nm to 50 μm. The thickness of the thin film is determined from a photograph of the vertical cross-section of the thin film that is taken by a transmission electron microscope, and the determined thicknesses from the photographs are averaged to obtain the average thickness of the thin film.

As the thin film, there are an inorganic film and an organic thin film. The inorganic thin film for use in the present invention is a film made of an inorganic material. Examples of the inorganic material for forming the thin film may include: metals; metal compounds such as metal oxides and metal nitrides; non-metals; and non-metal compounds such as non-metal oxides. Specific examples thereof may include: metals and non-metals such as aluminum, silicon, magnesium, palladium, platinum, zinc, tin, nickel, silver, copper, gold, antimony, yttrium, indium, stainless steel, chromium, titanium, tantalum, zirconium, niobium, lanthanum, and cerium; oxides and nitrides thereof; and mixtures thereof.

Preferably, the average thickness of the inorganic thin film is 1 nm to 5 μm. If the average thickness is less than 1 nm, the concavo-convex shape may not be easily formed. If the average thickness is greater than 5 μm, cracks may be easily formed in the inorganic thin film layer during shrinkage. When the inorganic thin film is used, a fine concavo-convex shape having an average distance between the apexes of the convexes of 50 nm to 10 μm can be easily obtained.

No particular limitation is imposed on the method for forming the inorganic thin film. Examples of the method may include: vapor deposition methods such as vacuum deposition, ion plating, sputtering, and CVD (chemical vapor deposition); application methods such as spin coating, dipping, roller coating, spraying, vaper coating, coater methods using a gravure coater or blade coater, screen printing, and ink-jet printing; electroless plating; and electroplating.

No particular limitation is imposed on the organic thin film so long as it shrinks to form a corrugation structure. Preferably, the shrinkage ratio of the organic thin film under the temperature condition for shrinking the reflecting layer film substrate is less than the shrinkage ratio of the reflecting layer film substrate. Preferably, the average thickness of the organic thin film is 100 nm to 50 μm. An average thickness of less than 100 nm is not preferred because it renders difficult to form the concavo-convex shape. An average thickness of greater than 50 μm is not preferred because it renders difficult to control the shapes of the concaves and convexes. When the organic thin film is used, a fine concavo-convex shape having an average distance between the apexes of the convexes of 500 nm to 50 μm can be easily obtained.

Examples of the organic thin film may include thin films made of a thermoplastic resin and thin films made of a curable resin.

As the thermoplastic resin, any of the above-exemplified thermoplastic resins for the reflecting layer film substrate may be used. The thin film may contain additives, as in the resin used for the reflecting layer film substrate.

Examples of the method for forming the organic thin film made of a thermoplastic resin may include: (1) a method in which the resin for forming the reflecting layer film substrate and the resin for forming the thin film are co-extruded; (2) a method in which a thermoplastic resin is formed into a thin film and the thin film is laminated onto the reflecting layer film substrate; and (3) a method in which a solution containing a thermoplastic resin is applied to the surface of the reflecting layer film substrate and then dried.

The curable resin may be a thermosetting resin or an energy ray curable resin. The energy rays may be visible light, ultraviolet light, an electron beam, or the like.

Specific examples of the thermosetting resin may include phenolic resins, urea resins, diallyl phthalate resins, melamine resins, guanamine resins, unsaturated polyester resins, polyurethane resins, epoxy resins, amino alkyd resins, melamine-urea co-condensation resins, silicon resins, and polysiloxane resins.

No particular limitation is imposed on the energy ray curable resin. Examples of the energy ray curable resin may include: resins having a radical polymerizable unsaturated functional group (such as an acryloyloxy group, a methacryloyloxy group, a vinyloxy group, a styryl group, or a vinyl group) and/or a cationic polymerizable functional group (such as an epoxy group, a thioepoxy group, a vinyloxy group, or an oxetanyl group). Specific examples thereof may include relatively low molecular weight polyester resins, polyether resins, acrylic resins, methacrylic resins, epoxy resins, urethane resins, alkyd resins, spiroacetal resins, polybutadiene resins, and polythiol-polyene resins.

When ultraviolet light or visible light is used as the energy rays, a photo-polymerization initiator, a photo-sensitizer, and other additives are added to the curable resin. Examples of the photo-polymerization initiator may include acetophenones, bonzophenones, Michler's benzoyl benzoate, α-amyloxime ester, tetramethylthiuram monosulfide, and thioxanthones. Examples of the photo-sensitizer may include n-butylamine, triethylamine, and tri-n-butylphosphine.

The thin film made of the curable resin may contain additives such as curing agents (for example, a cross-linking agent and a polymerization initiator), a polymerization promoter, a solvent, and a viscosity modifier.

No particular limitation is imposed on the method for forming the organic thin film made of the curable resin. For example, the organic thin film made of the curable resin may be obtained by applying the curable resin composition to the surface of the reflecting layer film substrate and curing the applied composition. Preferably, when the curable resin thin film is formed, heat treatment is performed at a temperature at least 5° C. lower than the glass transition temperature T1 of the reflecting layer film substrate. If high temperature is applied during formation of the thin film, the reflecting layer film substrate is annealed, which may not shrink in a designed manner. Preferably, a curable resin thin film is used as the organic thin film because the fine concavo-convex shape may be easily controlled.

(Corrugated Reflecting Layer: Corrugation Inducing Structure)

When there is a need to improve the uniformity of the distances between the apexes of the convexes (convex ridges or concave ridges) in the concavo-convex shape (ridges), it is preferable that the production method includes: forming, before the thin film is formed on the surface of the reflecting layer film substrate, structures for inducing a corrugation in the thin film (corrugation inducing structures) on the surface of the reflecting layer film substrate; or forming, after the thin film is formed on the surface of the reflecting layer film substrate and before the substrate is shrunk, structures for inducing a corrugation in the thin film (corrugation inducing structures) on the thin film. No particular limitation is imposed on these structures so long as they induce a corrugation in the thin film during shrinkage of the substrate. Examples of these structures may include: surface flaws formed by rubbing treatment or other methods; ink marks formed by an ink-jet printer, a printer, or the like; and concaves and convexes formed by embossing, imprinting, or the like. Preferably, the corrugation inducing structures are formed at positions spaced apart at regular intervals. The spacing distance between the corrugation inducing structures is not directly related to the desired distances between the apexes of the convexes in the concavo-convex shape and may be larger or smaller than the desired distances between the apexes of the convexes in the concavo-convex shape. Preferably, the spacing distance between the corrugation inducing structures is 0.05 to 100 times the desired distances between the apexes of the convexes in the desired concavo-convex shape.

Next, the reflecting layer film substrate having the thin film formed on its surface is shrunk to corrugate the thin film. The method for shrinking the reflecting layer film substrate may be appropriately selected in accordance with the type of the reflecting layer film substrate.

To prevent occurrence of cracks or the like in the thin film and other layer when the thin film is corrugated due to the shrinkage of the reflecting layer film substrate, it is preferable that the shrinkage ratio of the reflecting layer film substrate satisfy inequalities [7] and [8] where the shrinkage ratio in the principal shrinkage direction is $\Delta L$ and the shrinkage ratio in the direction orthogonal to the principal shrinking direction is $\Delta M$.

$\Delta L$ and $\Delta M$ are defined in equations [5] and [6], respectively.

$$\Delta L = (L0-L1)/L0 \times 100 \text{ ($L0$: the length in the principal shrinkage direction before shrinkage, $L1$: the length in the principal shrinkage direction after shrinkage)} \quad \text{Equation [5]}$$

$$\Delta M = (M0-M1)/M0 \times 100 \text{ ($M0$: the length in the direction orthogonal to the principal shrinkage direction before shrinkage, $M1$: the length in the direction orthogonal to the principal shrinkage direction after shrinkage)} \quad \text{Equation [6]}$$

$$\Delta L > 0 \quad \text{Inequality [7]}$$

$$-(\Delta L \times 0.3) \leq \Delta M \leq \Delta L \quad \text{Inequality [8]}$$

When there is a need to increase the anisotropy of the fine concavo-convex shape, i.e., when there is a need to form the concavo-convex shape as a structure in a shape of slim elongated stripes in a plane, it is preferable to satisfy inequalities [7] and [9].

$$-(\Delta L \times 0.2) \leq \Delta M \leq (\Delta L \times 0.2) \quad \text{Inequality [9]}$$

Since the distances between the apexes of the convexes and the height between the concaves and convexes can be freely controlled by simply changing the shrinking conditions, this method is suitable for the production of a corrugated reflecting layer having ridges.

The principal shrinkage direction is a direction in which the degree of shrinkage (shrinking ratio) is largest. For example, a reflecting layer film substrate obtained by stretching a film made of a thermoplastic resin shrinks upon heating. When the film is stretched only in one direction, the stretching direction is usually the principal shrinking direction. When the film is stretched in two stretching directions, the direction having a larger stretching ratio is usually the principal shrinkage direction.

When a film made of a thermoplastic resin is stretched uniaxially, the film shrinks during stretching in a direction orthogonal to the stretching direction. In a reflecting layer film substrate that utilizes the shrinkage during stretching, the principal shrinkage direction is a direction orthogonal to the stretching direction. When the value of the shrinkage ratio $\Delta M$ in the direction orthogonal to the principal shrinkage direction is negative, the film has been elongated in the shrinking treatment. If excessively large elongation occurs in the direction orthogonal to the principal shrinkage direction during shrinkage of the film in the principal shrinkage direction, cracks may be easily formed in the thin film.

The shrinkage ratio in the direction orthogonal to the principal shrinkage direction is preferably 1% to 90% and more preferably 15 to 50%.

The level difference of the concaves and convexes in the corrugation structure in the corrugated reflecting layer is preferably 0.3 µm or more because thereby good diffusing effects and good color correction effects can be obtained.

A layer contained in the aforementioned corrugated multilayer body as it may be used as the reflecting layer for the present invention. Alternatively, another layer may be formed on the corrugated multilayer body for use as the reflecting layer in the present invention. When, for example, one of the layers constituting the corrugated multilayer body (for example, the inorganic thin film made of, for example, aluminum) has a light-reflecting ability, that layer may be used as the reflecting layer to configure the device of the present invention. In this case, other layer(s) constituting the corrugated multilayer body (such as the reflecting layer film substrate) may be located at positions closer to the luminescent layer than the reflecting layer when that other layer(s) allow light to pass therethrough. Alternatively that other layer(s) may be located at positions farther from the luminescent layer than the reflecting layer.

If none the aforementioned thin film and the reflecting layer film substrate have a sufficient light reflecting ability, another layer having a light reflecting ability is stacked on the corrugated multilayer body to form a corrugated reflecting layer. Examples of the layer having a light reflecting ability may include the metal reflecting layer of, for example, aluminum as mentioned above.

Figure 16:
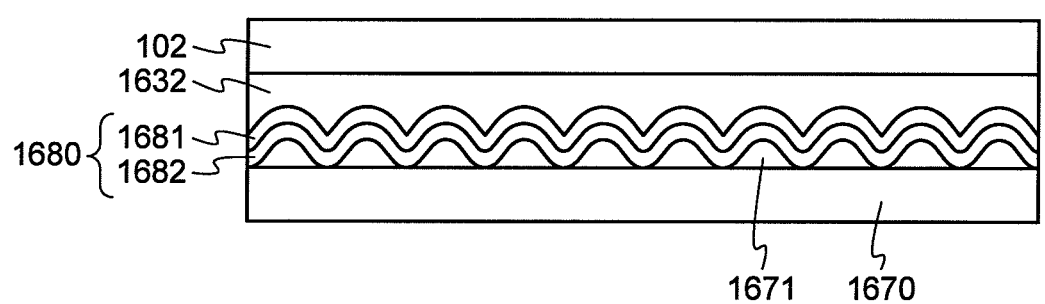
FIG. 16 is a vertical cross-sectional view schematically illustrating a configuration of a reflecting layer and its adjacent layers in an organic EL light source device according to yet another embodiment of the present invention.

FIG. 16 shows an exemplary embodiment in which the corrugated reflecting layer is used as the reflecting layer in a device of the present invention. In FIG. 16, the layers closer to the light-emitting surface than the sealing substrate 102 are omitted. In the embodiment shown in FIG. 16, the sealing substrate 102 is bonded to a corrugated reflecting layer 1680 via a bonding layer 1632. For the purpose of supporting and protecting the corrugated reflecting layer 1680, a support substrate 1670 is provided. If necessary, the gap 1671 between the corrugated reflecting layer 1680 and the support substrate 1670 may be filled with a bonding layer, etc. The corrugated reflecting layer 1680 includes a layer 1681 located closer to the luminescent layer and a layer 1682 located further from the luminescent layer. One of these layers may be formed as an inorganic thin film having a light reflecting ability, and the other layer may be formed as the reflecting layer film substrate.

(Applications)

No particular limitation is imposed on the applications of the organic EL light source devices of the present invention. Utilizing their advantages such as high light extraction efficiency, the organic EL light source devices of the present invention may be used as a backlight of a liquid crystal display and a light source of a lighting device.

The light source devices of the present invention includes not only those specifically described above but also those within the scope of the claims and all equivalents thereto. For example, although the essential components of the light source device of the present invention are the first transparent electrode layer, the luminescent layer, the second transparent electrode layer, and the reflecting layer (alternatively, in place of the reflecting layer, the diffusing layer and the reflecting-scattering layer), the device of the present invention may additionally have an optional layer other than the above-exemplified diffusing plate, the sealing layer, the reflecting substrate, and other layers. Such an optional layer may be disposed as an optional component at a position between the essential layers, a position closer to the light-emitting surface than the first transparent electrode layer, or a position farther from the light-emitting surface than the reflecting layer (on the side opposite to the light-emitting surface). Although the substrate and the sealing substrate on the upper and lower side of the luminescent element, the sealing layer, and other layers are exemplified as layers for sealing the luminescent element, the device of the present invention may additionally have a sealing member for sealing the edge portion of the luminescent element. Moreover, other optional components needed for configuring the light source device, such as electricity application means for applying electricity to the electrodes, may be provided.

EXAMPLES

Hereinafter, the present invention will be described in more detail by way of Examples. However, the present invention is not limited to the following Examples.

Preparative Example 1

Preparation of Adhesive for Sealing Layer 300 parts by weight of polyisoprene was thoroughly dissolved in 700 parts by weight of toluene. Then 2.4 parts by weight of p-toluenesulfonic acid was added to the solution, and the mixture was subjected to cyclization reaction to obtain a solution of a cyclized polymer.

2.5 parts by weight of maleic anhydride per 100 parts by weight of the cyclized polymer in the obtained solution was added to the solution to perform an addition reaction.

Part of toluene in the solution was removed by evaporation, and an antioxidant was added to the solution. Then the mixture was vacuum dried to remove toluene and unreacted maleic anhydride, whereby a modified cyclized conjugated diene polymer-based adhesive was obtained.

Preparative Example 2

Production of Corrugated Reflecting Layer 97 parts by weight of an ultraviolet curable resin (product name: LC242, product of BASF) and 3 parts by weight of a photo-polymerization initiator (product name: Irgacure 907, product of Ciba Specialty Chemicals) were dissolved in 150 parts by weight of methyl ethyl ketone to prepare an ultraviolet curable resin solution.

The prepared solution for a curable resin thin film was continuously applied to a stretched film substrate (ZEONOR film, product of ZEON Corporation) using a die coater. The solution was dried at 80° C. for 5 minutes, and then irradiated with ultraviolet light (accumulated light amount: 500 mJ/cm$^2$) to cure the resin, for forming thin film. A multilayer film was thereby obtained. The average thickness of the thin film after curing was 2.2 μm.

Then the surface of the thin film was rubbed in a film-travelling direction. An observation under a scanning electron microscope revealed that linear flaws along the film-flowing direction were uniformly formed on the surface of the thin film. Then the multilayer film was conveyed to pass through a warm-air dryer in which warm air having a temperature of 140° C. was circulated, to cause shrinkage in the principal shrinkage direction at a shrinkage ratio ΔL of 20%.

The shrunk film was observed under a field emission scanning electron microscope S-4700 manufactured by Hitachi Ltd. It was found that a fine concavo-convex shape of slim elongated stripes was uniformly formed on a surface on the side coated with the ultraviolet curable resin. The scanning electron microscope image was subjected to two-dimensional fast Fourier transform using image analysis software (AnlySIS, product of Soft Imaging System), and the power spectrum distribution of spatial frequencies was determined to find a direction in which periodicity appeared strongly. The film was cut in this direction using ultramicrotome, and photographs of the cross-section were taken with the scanning electron microscope (S-4700, product of Hitachi Ltd.). The photographs were taken at three points separated by at least 10 cm in the width and traveling directions of the film. On the scanning electron microscope image, the distances between the apexes of the convexes were measured at 30 points. The average of the distances between the apexes of the convexes was 9.5 μm, and the average inclination angle was 24°.

Then an aluminum layer having a thickness of 1,000 nm was formed on the film substrate side of the obtained shrunk film by vacuum deposition, to obtain a corrugated reflecting layer.

Example 1

The configuration of the organic EL light source device of the present invention having the structure of the first embodiment shown in FIG. 1 was examined.

Simulation was performed as to the organic EL light source device shown in FIG. 1, wherein the refractive indices of the luminescent layer 121 and the first and second transparent electrodes (ITO) were set to 1.8, the refractive indices of the sealing layer 131 and the bonding layer 132 were set to 1.53, the refractive indices of the substrate 101 and the sealing substrate 102 were set to 1.53, the reflectivity of the metal reflecting layer 142 was set to 100%, and the ratio of light absorbed by the luminescent element 120 when the light passed through the optical density of the luminescent element 120 in a front direction was set to 10%. The shape of the concavo-convex structure of the reflecting layer was set to a quadrangular pyramid shape shown in FIG. 17. The orientation characteristics (initial orientation characteristics) of the light emitted from the luminescent element 120 toward the substrate 101 and the sealing layer 131 was set to any of the three types of characteristics described below. Then the relationship between the average inclination angle (°) of the quadrangular pyramids and the light extraction efficiency (%) from the light-emitting surface 100A was examined using a program (program name: Light Tools, product of Optical Research Associates). The results are shown in FIG. 2.

Initial orientation characteristics A: luminous intensity $(\theta)=\cos\theta \times \cos\theta$
Initial orientation characteristics B: luminous intensity $(\theta)=\cos\theta$
Initial orientation characteristics C: luminous intensity $(\theta)=1$ In these formulae, θ is an angle (°) between the normal direction of the principal surface of the luminescent layer and an observation direction, and the luminous intensity (θ) is a luminous intensity when the observation is performed from the direction.

In addition, for the initial orientation B, the light extraction efficiency (%) when the refractive index of the bonding layer 132 was changed to 1.4 or 1.65 was also examined. The results are shown in FIG. 3.

Figure 2:
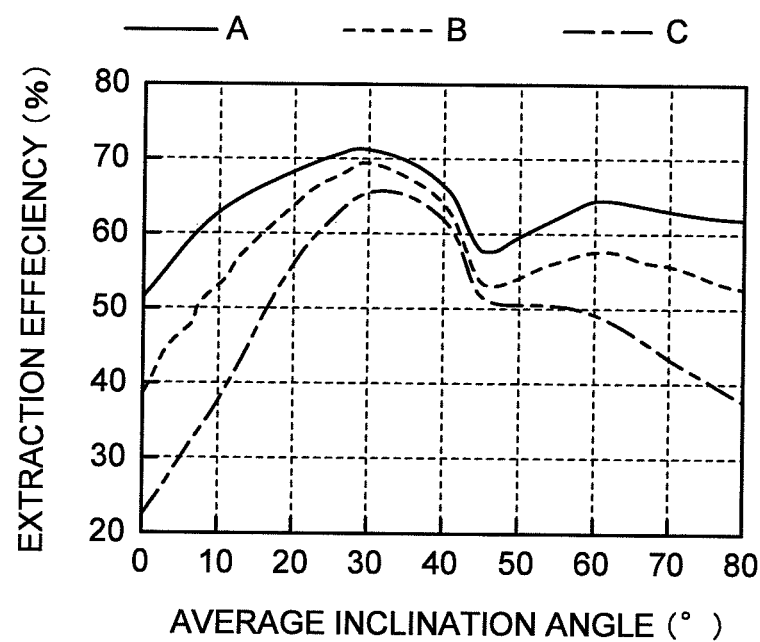
FIG. 2 is a graph showing the relationship between the average inclination angle of a concavo-convex structure 141 and the light extraction efficiency as to the organic EL light source device shown in FIG. 1 with a variety of initial light orientation characteristics.
Figure 3:
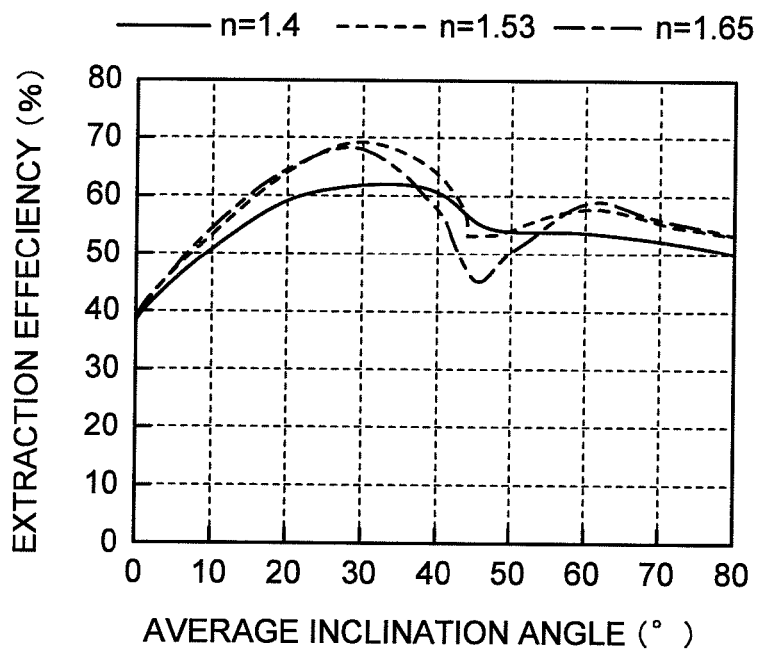
FIG. 3 is a graph showing the relationship between the average inclination angle of the concavo-convex structure 141 and the light extraction efficiency as to the organic EL light source device shown in FIG. 1 with a variety of different refractive indices of a bonding layer 132.

As obvious from the results shown in FIGS. 2 and 3, the light extraction efficiency was particularly good when the average inclination angle was 12 to 45°.

Example 2

Based on the examination results in Example 1, an organic EL light source device having the configuration of the first embodiment shown in FIG. 1 was produced.
(2-1: Preparation of Luminescent Element)
An organic EL luminescent element including the first transparent electrode layer 111, the organic luminescent layer 121, and the second transparent electrode 112 was formed on one surface of a glass substrate 101 having a thickness of 1.1 mm.
(2-2: Preparation of Multilayer Body Having Sealed Luminescent Element)
The adhesive for a sealing layer obtained in Preparative Example 1 was applied to one surface of a glass sealing substrate 102 having a thickness of 0.7 mm, and the resultant was laminated onto the second transparent electrode layer side of the luminescent element obtained in (2-1). Electricity application means for the electrode layers was provided at the peripheral portion of the element and sealed with a peripheral sealing member (not shown in FIG. 1) to form a sealing layer 131 having a thickness of 15 μm. In this manner, a multilayer body having the substrate 101, the first transparent electrode layer 111, the organic luminescent layer 121, the second transparent electrode layer 112, the sealing layer 131, and the sealing substrate 102 was obtained.
(2-3: Reflecting Substrate)
A reflecting substrate 140 was formed from pellets of a resin having an alicyclic structure (ZEONOR, ZEON Corporation) using an injection molding apparatus. The reflecting substrate thus obtained had a thickness of 0.7 mm and had, on one surface, a concavo-convex structure consisting of concavo-convex structure units consisting of the quadrangular pyramid shape (height 141H was 2.9 μm, and base width 141BL was 10 μm) shown in FIGS. 17 and 18.
(2-4: Reflecting Layer Having Concavo-Convex Structure)
Onto the surface of the reflecting substrate 140 obtained in (2-3) on which the ridges had been formed, Ag was vapor-deposited to form a metal reflecting surface, whereby a multilayer body consisting of the reflecting substrate 140 and the reflecting layer 142 having the concavo-convex structure was obtained.
(2-5: Production of Light Source Device)
The surface of the multilayer body obtained in (2-4) on which the reflecting layer 142 had been formed was coated with the sealing adhesive obtained in Preparative Example 1, and the resultant was laminated onto the sealing substrate 102 of the multilayer body obtained in (2-2) to form a bonding layer 132 having a thickness of 18 μm (the distance between the highest position of the concavo-convex structure to the sealing substrate 102). In this manner, an organic EL light source device having the substrate 101, the first transparent electrode layer 111, the organic luminescent layer 121, the second transparent electrode layer 112, the sealing layer 131, the sealing substrate 102, the bonding layer 132, the reflecting layer 142, and the reflecting substrate 140 was obtained.

(2-6: Evaluation)
Electricity was applied to the obtained organic EL light source device to emit light. The luminous intensity was measured using EZ-contrast manufactured by ELDIM to determine the total luminous flux. The total luminous flux was increased 30% as compared to that when the concavo-convex structure was not provided.

Example 3

The configuration of an organic EL light source device of the present invention having the structure in the ninth embodiment shown in FIG. 11 was examined.

Figure 12:
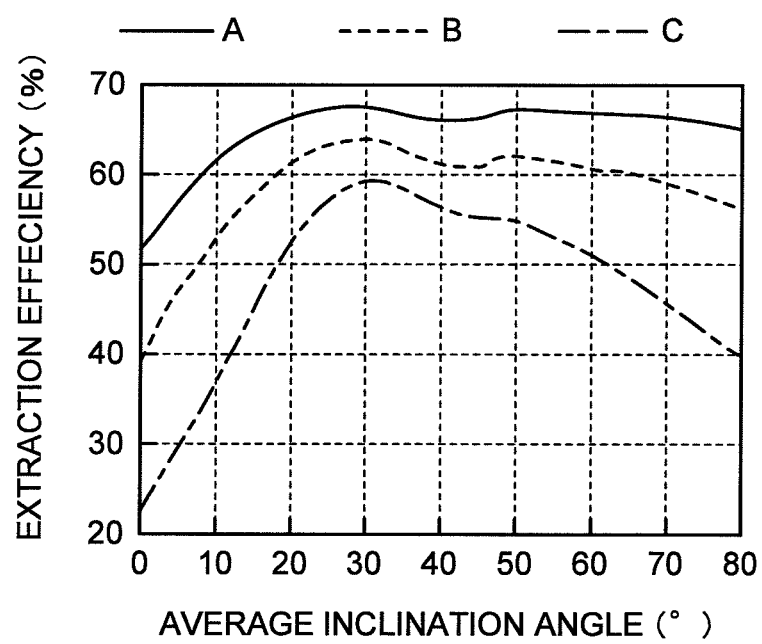
FIG. 12 is a graph showing the relationship between the average inclination angle of a concavo-convex structure 441 and the light extraction efficiency as to the organic EL light source device shown in FIG. 11 with a variety of initial light orientation characteristics.

The relationship between the light extraction efficiency and the average inclination angle of the concavo-convex structure 441 was determined for initial orientation characteristics A to C in the same manner as in Example 1, except that the bonding layer 132, the reflecting layer 142, and the reflecting substrate 140 were not provided but in place thereof a transparent concavo-convex layer 440 having a concavo-convex structure 441 and a flat reflecting-scattering layer 1149 were provided. The refractive index of the transparent concavo-convex layer 440 was set to 1.53, and the reflecting layer is set to have a reflectance of 100% with Lambert scattering. Specific configuration of the concavo-convex structure 441 is set to be the same quadrangular pyramid structure as the concavo-convex structure 141 in Example 1. The results are shown in FIG. 12. The light extraction efficiency (%) when the refractive index of the transparent concavo-convex layer 440 was changed to 1.4 or 1.65 was also examined. The results are shown in FIG. 13.

Figure 13:
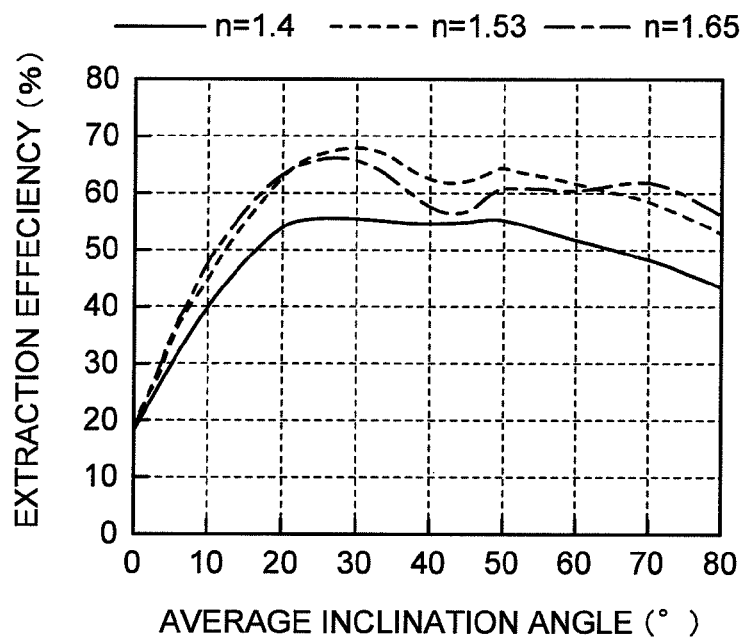
FIG. 13 is a graph showing the relationship between the average inclination angle of the concavo-convex structure 441 and the light extraction efficiency as to the organic EL light source device shown in FIG. 11 with a variety of different refractive indices of a transparent concavo-convex layer 440.

As obvious from the results shown in FIGS. 12 and 13, the light extraction efficiency was particularly good when the average inclination angle was 17 to 45°.

Example 4

Based on the examination results in Example 3, an organic EL light source device having the structure of the ninth embodiment shown in FIG. 11 was produced.

As the material for the bonding layer 432, the adhesive obtained in Preparative Example 1 was used. As the transparent concavo-convex layer 440, the same reflecting substrate as the reflecting substrate 140 obtained in Example 1 was used, although the substrate was turned upside down for use. A multilayer body including the substrate 101, the first transparent electrode layer 111, the organic luminescent layer 121, the second transparent electrode layer 112, the sealing layer 131, the sealing substrate 102, the bonding layer 432, and the transparent concavo-convex layer 440 was obtained in the same manner as in (2-1) to (2-5) of Example 2, except that the reflecting layer 142 was not provided and that the reflecting substrate 140 turned upside down was used as the transparent concavo-convex layer 440. The multilayer body was placed on a reflecting-scattering layer ("Lumirror (trade name)," product of TORAY Industries Inc.) to form an organic EL light source device 1100.

Electricity was applied to the obtained organic EL light source device to emit light. The luminous intensity was measured using EZ-contrast manufacture by ELDIM to determine the total luminous flux. The total luminous flux was increased 25% as compared to that when the concavo-convex structure was not provided.

Example 5

The corrugated reflecting layer obtained in Preparative Example 2 was bonded with the adhesive obtained in Preparative Example 1 to the sealing substrate 102 of the multilayer body obtained in step (2-2) in Example 2 such that the aluminum layer was disposed on the light-emitting surface side, whereby an organic EL light source device was produced.

Electricity was applied to the obtained organic EL light source device to emit light. The luminous intensity was measured using EZ-contrast manufactured by ELDIM to determine the total luminous flux. The total luminous flux was increased 20% as compared to that when the concavo-convex structure was not provided.

The invention claimed is:

1. An organic electroluminescent light source device, comprising a first transparent electrode layer, a luminescent layer, a second transparent electrode layer, and a reflecting layer, the layers being in this order from a light-emitting surface side, wherein:
the reflecting layer has a reflecting layer concavo-convex structure with an average inclination angle of 12 to 45%,
a sealing layer formed of an inert liquid or a liquid crystal material is disposed between the second transparent electrode layer and the reflecting layer, and
the sealing layer is in direct contact with the second transparent electrode layer and with the reflecting layer.

2. The organic electroluminescent light source device according to claim 1, wherein:
the reflecting layer concavo-convex structure is a structure having a curved surface.

3. The organic electroluminescent light source device according to claim 1, further comprising a light-emitting surface diffusing layer disposed at a position closer to a light-emitting surface than the first transparent electrode layer.

4. The organic electroluminescent light source device according to claim 3, wherein:
the light-emitting surface diffusing layer has on the light-emitting surface side surface thereof a light-emitting surface diffusing layer concavo-convex structure, the light-emitting surface diffusing layer concavo-convex structure consisting of ridge-shaped concavo-convex structure units, and
the reflecting layer concavo-convex structure consists of ridge-shaped concavo-convex structure units.

5. A method for producing the organic electroluminescent light source device according to claim 1, comprising:
forming a thin film on one surface of a reflecting layer film substrate to produce a multilayer body, and
shrinking the multilayer body in at least one in-plane axial direction to corrugate the thin film, to obtain the reflecting layer having a corrugation structure as the reflecting layer concavo-convex structure.

6. The organic electroluminescent light source device according to claim 1, wherein:
the reflecting layer has a metal layer.

7. The organic electroluminescent light source device according to claim 6, wherein:
the reflecting layer further has a functional layer provided on a surface of the metal layer.

8. An organic electroluminescent light source device, comprising a first transparent electrode layer, a luminescent layer, a second transparent electrode layer, a diffusing layer, and a reflecting-scattering layer, the layers being in this order from a light-emitting surface side, wherein:
the diffusing layer has a concavo-convex surface, the concavo-convex surface having a concavo-convex structure with an average inclination angle of 17 to 45°, and
the reflecting-scattering layer is a white layer.

9. The organic electroluminescent light source device according to claim 8, wherein:
the concavo-convex surface is a surface containing a curved surface.

10. The organic electroluminescent light source device according to claim 8, further comprising a light-emitting surface diffusing layer disposed at a position closer to a light-emitting surface than the first transparent electrode layer.

11. The organic electroluminescent light source device according to claim 10, wherein:
the light-emitting surface diffusing layer has on the light-emitting surface side surface thereof a light-emitting surface diffusing layer concavo-convex structure, the light-emitting surface diffusing layer concavo-convex structure consisting of ridge-shaped concavo-convex structure units, and
the concavo-convex structure of the concavo-convex surface consists of ridge-shaped concavo-convex structure units.

12. The organic electroluminescent light source device according to claim 8, wherein:
the diffusing layer and the reflecting-scattering layer are provided with an air layer disposed therebetween.

* * * * *